(12) United States Patent
Miyamatsu et al.

(10) Patent No.: US 7,580,111 B2
(45) Date of Patent: Aug. 25, 2009

(54) LIQUID FOR IMMERSION EXPOSURE AND IMMERSION EXPOSURE METHOD

(75) Inventors: Takashi Miyamatsu, Tokyo (JP); Hiroaki Nemoto, Tokyo (JP); Yong Wang, Tokyo (JP)

(73) Assignee: JSR Corporation, Tokyo (JP)

( * ) Notice: Subject to any disclaimer, the term of this patent is extended or adjusted under 35 U.S.C. 154(b) by 555 days.

(21) Appl. No.: 10/588,263

(22) PCT Filed: May 19, 2005

(86) PCT No.: PCT/JP2005/009128

§ 371 (c)(1),
(2), (4) Date: Aug. 3, 2006

(87) PCT Pub. No.: WO2005/114711

PCT Pub. Date: Dec. 1, 2005

(65) Prior Publication Data

US 2007/0164261 A1    Jul. 19, 2007

(30) Foreign Application Priority Data

| May 21, 2004 | (JP) | 2004-151711 |
|---|---|---|
| Aug. 31, 2004 | (JP) | 2004-252289 |
| Jan. 19, 2005 | (JP) | 2005-011431 |
| Feb. 24, 2005 | (JP) | 2005-049468 |

(51) Int. Cl.
G03B 27/42 (2006.01)
G03B 27/52 (2006.01)

(52) U.S. Cl. .......................................... 355/53; 355/30

(58) Field of Classification Search .................. 355/53, 355/30, 55
See application file for complete search history.

(56) References Cited

U.S. PATENT DOCUMENTS

| 5,817,256 A | 10/1998 | Weippert |
|---|---|---|
| 2002/0006675 A1 | 1/2002 | Shigaraki |
| 2004/0242825 A1 | 12/2004 | Shishido et al. |

FOREIGN PATENT DOCUMENTS

| AU | 2747999 | 10/1999 |
|---|---|---|
| JP | 60-209536 | 10/1985 |
| JP | 62-094813 | 5/1987 |
| JP | 06-12452 | 2/1994 |
| JP | 07-220990 | 8/1995 |
| JP | 09-241214 | 9/1997 |
| JP | 10-303114 | 11/1998 |
| JP | 11-176727 | 7/1999 |
| JP | 11-233402 | 8/1999 |
| JP | 2001-068400 | 3/2001 |
| JP | 2001-181217 | 7/2001 |
| JP | 2001-326162 | 11/2001 |
| JP | 2002-255866 | 9/2002 |
| JP | 2003-160515 | 6/2003 |
| JP | 2004-123762 | 4/2004 |
| JP | 2005-072230 | 3/2005 |
| WO | WO99/49504 | 9/1999 |
| WO | WO01/32739 | 5/2001 |
| WO | WO03/016365 | 2/2003 |

OTHER PUBLICATIONS

Inside Memory, Nikkei Microdevice, p. 77-86 (Apr. 2004).
Smith, et al., Approaching the numerical aperture of water-Immersion lithography at 193nm, Proc. SPIE, Vol. 5377, pp. 273-284 (2004).
Sylvester-Hvid, et al., Refractive Indices of Molecules in Vapor and Liquid: Calculations on Benzene, J. Phys. Chem. A, vol. 103, No. 42, pp. 8447-8457 (1999).
Immersion Lithography Modeling 2003 year-End Report (International SEMATECH).
The seminar text of special seminar on immersion exposure technology, pp. 14-33 (May 27, 2004).

*Primary Examiner*—Peter B Kim
(74) *Attorney, Agent, or Firm*—Ditthavong Mori & Steiner, P.C.

(57) ABSTRACT

An immersion exposure liquid which exhibits a high refractive index, prevents elution and dissolution of a photoresist film or its upper layer film component, and reduces defects during formation of a resist pattern when used in an immersion exposure method, and an immersion exposure method using the immersion exposure liquid. The immersion exposure liquid is used for an immersion exposure device or an immersion exposure method in which a substrate is exposed through a liquid provided between a lens of a projection optical system and the substrate, the immersion exposure liquid being liquid in an operating temperature range of the immersion exposure device and including an alicyclic hydrocarbon compound or a cyclic hydrocarbon compound containing a silicon atom in the ring structure.

18 Claims, No Drawings

LIQUID FOR IMMERSION EXPOSURE AND IMMERSION EXPOSURE METHOD

TECHNICAL FIELD

The present invention relates to an immersion exposure liquid and an immersion exposure method, and particularly to the immersion exposure liquid, the immersion exposure method, a method of producing the immersion exposure liquid, an evaluation method for the immersion exposure liquid, and a novel liquid composition.

BACKGROUND ART

In the manufacture of semiconductor devices and the like, a stepping or step-and-scan projection exposure device (aligner) has been used in which a pattern of a reticle (photomask) is transferred onto each shot region on a wafer provided with a photoresist through a projection optical system.

The theoretical limit of the resolution of the projection optical system provided in the projection exposure device increases as the exposure wavelength used becomes shorter and the numerical aperture of the projection optical system becomes greater. Therefore, the exposure wavelength which is the wavelength of radiation used in the projection exposure device has been reduced along with scaling down of integrated circuits, and the numerical aperture of the projection optical system has been increased.

The depth of focus is also important for exposure in addition to the resolution. The theoretical limits of the resolution R and the depth of focus δ are respectively shown by the following expressions.

$$R = k1 \cdot \lambda / NA \quad \text{(i)}$$

$$\delta = k2 \cdot \lambda / NA^2 \quad \text{(ii)}$$

In the above expressions, λ is the exposure wavelength, k1 and k2 are process coefficients, and NA is the numerical aperture of the projection optical system, which is defined by the following expression (ii') when the refractive index of air is 1. Specifically, when obtaining the same resolution R, a larger depth of focus δ is obtained by using radiation with a shorter wavelength.

$$NA = \sin\theta \text{ (}\theta\text{=maximum incident angle of exposure light with respect to resist surface)} \quad \text{(ii')}$$

As described above, the demand for scaling down of integrated circuits has been satisfied by reducing the wavelength of the exposure light source and increasing the numerical aperture. At present, mass production of a 1L1S (1:1 line and space) 90-nm half-pitch node is studied using an ArF excimer laser (wavelength: 193 nm) as the exposure light source. However, it is difficult to achieve the next generation 65-nm half-pitch node or 45-nm half-pitch node using only the ArF excimer laser. Therefore, use of a light source with a shorter wavelength such as an $F_2$ excimer laser (wavelength: 157 nm) or an extreme ultraviolet (EUV) laser (wavelength: 13 nm) has been studied for the next generation technology. Note that it is difficult to use these light sources under the present situation due to technological difficulty.

In the above exposure technology, a photoresist film is formed on the surface of the exposure target wafer, and the pattern is transferred to the photoresist film. In a related-art projection exposure device, the space in which the wafer is placed is filled with air having a refractive index of 1, or nitrogen. When the space between the wafer and the lens of the projection exposure device is filled with a medium having a refractive index of n, the theoretical limits of the resolution R and the depth of focus δ are shown by the following expressions.

$$R = k1 \cdot (\lambda/n)/NA \quad \text{(iii)}$$

$$\delta = k2 \cdot n\lambda/NA^2 \quad \text{(iv)}$$

In the above expressions, NA is not the actual numerical aperture of the projection optical system, but refers to the constant defined by the above expression (ii') (the numerical aperture NA' of the projection optical system is expressed by NA'=n sin θ (n is the same as defined above)).

The above expressions mean that the limit of the resolution and the depth of focus can be theoretically increased by 1/n and n, respectively, by filling the space between the lens of the projection exposure device and the wafer with a liquid having a refractive index of n to provide an appropriate optical system. For example, when using water as the above medium in the ArF process, since water has a refractive index n for light with a wavelength of 193 nm of 1.44, an optical system can be theoretically designed in which the resolution R is 69.4% (R=k1·(λ/1.44)/NA) and the depth of focus is 144% (δ=k2·1.44λ/$NA^2$) of the values during exposure using air or nitrogen as the medium.

The above projection exposure method in which the effective wavelength of exposure radiation is reduced to transfer a more minute pattern is called an immersion exposure method. The immersion exposure method is considered to be an essential technology for lithography with reduced dimensions, particularly for lithography with dimensions of several ten nanometers (Japanese Patent Application Laid-open No. 11-176727).

As the liquid provided between the lens of the projection optical system and the substrate in the immersion exposure method, use of pure water has been studied for the ArF excimer laser, and use of a fluorine-based inert liquid has been studied for the $F_2$ excimer laser due to high transparency to light with a wavelength of 157 nm.

Pure water is easily available in a semiconductor manufacturing factory and does not pose an environmental problem. Moreover, since the temperature of pure water can be easily adjusted, thermal expansion of the substrate due to heat generated during exposure can be prevented. Therefore, pure water has been used as the ArF immersion liquid (International Publication No. WO 99/49504), and is certain to be used for mass production of 65-nm half-pitch node devices.

A liquid has also been known in which methyl alcohol or the like is added to pure water as an additive which decreases the surface tension and increases the surface activity of pure water (Japanese Patent Application Laid-open No. 10-303114).

On the other hand, pure water may permeate the photoresist film, whereby shape deterioration may occur in which the photoresist pattern has a T-top cross-sectional shape, or the resolution may be decreased. Moreover, water-soluble components such as a photoacid generator and basic additive of the photoresist and acids generated upon exposure may be eluted (dissolved) in water, thereby causing shape deterioration such as a T-top shape, a decrease in resolution and depth of focus, bridge defects, defects in the developed pattern, or contamination of the lens surface. The elution of these components into the liquid also causes contamination of the liquid, thereby making it difficult to recycle the liquid. Therefore, complicated purification must be frequently carried out.

An upper layer film may be formed on the photoresist film in order to protect the photoresist film from water. However, the upper layer film may exhibit insufficient transparency for exposure light or insufficient intermixing properties with the photoresist film, or may complicate the manufacturing process. It has been reported that $CaF_2$ used as the lens material is eroded by water (non-patent document: Nikkei Microdevice, April 2004, p. 77). This makes it necessary to coat the lens surface with a coating material.

On the other hand, since the resolution obtained using pure water is limited to the value about 1.44 times that of ArF dry exposure, as indicated by the above expression (iii), it may become difficult to use pure water for the next generation technology particularly with a half pitch of 45 nm or less.

As described above, a liquid having a refractive index for light with an exposure wavelength (e.g. 193 nm) greater than that of pure water and exhibiting high transparency to light with such a wavelength has been demanded for the next generation immersion exposure method. This liquid must not adversely affect the photoresist film due to elution of the additive from the photoresist film, dissolution of the resist film, deterioration of the pattern, and the like, and must not erode the lens. Moreover, since the use of polarized light as the exposure light has been studied along with an increase in NA accompanying introduction of immersion exposure, the liquid is also required to not rotate the polarization direction due to optical activity or the like.

In order to achieve the above objects, an attempt has been made to increase the refractive index by dissolving various salts in water (non-patent document: Proc. SPIE Vol. 5377 (2004) p. 273), for example. However, this approach has problems such as difficulty in controlling the salt concentration or occurrence of development defects or lens contamination due to elution of water-soluble components.

A fluorine-based inert liquid such as perfluoropolyether which has been studied for $F_2$ exposure has a low refractive index for light with a wavelength of 193 nm, for example. Therefore, it is difficult to use such a fluorine-based inert liquid at such a wavelength. An organic bromide or iodide known as a microscope immersion exposure liquid due to the high refractive index for light with a wavelength of 589 nm exhibits poor transparency to light with a wavelength of 193 nm and insufficient stability for the photoresist film, for example.

DISCLOSURE OF THE INVENTION

Problems to be Solved by the Invention

The present invention was achieved in order to solve the above-described problems. An object of the present invention is to provide an immersion exposure liquid which exhibits a refractive index higher than that of pure water, exhibits excellent transparency at an immersion exposure wavelength, prevents elution and dissolution of a photoresist film or its upper layer film component (particularly hydrophilic component), does not erode a lens, and reduces defects during formation of a resist pattern when used for an immersion exposure method, and which reduces deterioration of the pattern shape, can form a pattern with a more excellent resolution and depth of focus, and is easily recycled and purified when used as an immersion exposure liquid, and an immersion exposure method using the liquid.

Another object of the present invention is to provide a method of producing the immersion exposure liquid, an evaluation method for the immersion exposure liquid, and a novel liquid composition.

Means for Solving the Problems

In order to achieve the above objects, it is indispensable for the immersion exposure liquid to exhibit a high transmittance of light with an immersion exposure wavelength which may be used for immersion exposure and a refractive index sufficiently higher than that of water. It is known that the refractive index of a liquid in the ultraviolet region depends on the polarizability of the molecule of the liquid. In order to increase the polarizability, it is generally effective to introduce an element having an n electron with high mobility such as sulfur, bromine, or iodine into the molecule and introduce a carbon-carbon double bond, a carbon-carbon triple bond, and particularly an aromatic ring having a n electron with relatively high mobility. However, a compound having such an element and molecular structure generally exhibits a strong absorption in the far ultraviolet region such as 193 nm and cannot be used for the above objects. As examples of a compound which exhibits a small absorption in the far ultraviolet region, an unsubstituted hydrocarbon compound, cyanated hydrocarbon compound, fluorinated hydrocarbon compound, sulfonate compound, some alcohols, and the like can be given. These compounds generally have a refractive index higher than that of water, but their refractive indices do not differ to a large extent from the refractive index of water.

As a more accurate theoretical formula of the refractive index of a liquid, the following formula (Lorentz-Lorenz formula) has been proposed. It has been reported that the refractive index n of benzene can be accurately estimated using the following formula (J. Phy. Chem. A., Vol. 103, No. 42, 1999 p 8447).

$$n=(1+4\pi N\alpha^{eff})^{0.5}$$

In the above formula, N indicates the number of molecules per unit volume, which becomes larger as the partial molar volume becomes smaller.

From the above formula, even when α cannot be increased by introducing a high-absorption functional group, the refractive index is expected to be increased by increasing N. The inventors of the present invention conducted extensive studies on the molecular structure of a liquid based on the above formula as a reference. As a result, the inventors have found that an alicyclic hydrocarbon according to the present invention which exhibits a high density due to its compact structure or a liquid containing silicon and having a cyclic hydrocarbon skeleton exhibits high transparency and a high refractive index and, when used as an immersion exposure liquid, prevents elution and dissolution of a photoresist film or an upper layer film component (particularly hydrophilic component), reduces defects during formation of a resist pattern and erosion of a lens, and can form a pattern with a more excellent resolution and depth of focus. This finding has led to the completion of the present invention.

Specifically, the present invention provides an immersion exposure liquid used for an immersion exposure device or an immersion exposure method in which a substrate is exposed through a liquid provided between a lens of a projection optical system and the substrate, the immersion exposure liquid being liquid in an operating temperature range of the immersion exposure device and comprising an alicyclic hydrocarbon compound or a cyclic hydrocarbon compound containing a silicon atom in its ring structure.

In particular, the alicyclic hydrocarbon compound or the cyclic hydrocarbon compound containing a silicon atom in its ring structure has a transmittance of radiation with a wavelength of 193 nm of 70% or more at an optical path length of 1 mm, and has a refractive index for D lines of 1.4 or more, and preferably 1.4 to 2.0.

The present invention also provides an immersion exposure method comprising applying an exposure beam to a mask and exposing a substrate using the exposure beam through a liquid provided between a lens of a projection optical system and the substrate, the liquid being the above immersion exposure liquid.

EFFECTS OF THE INVENTION

Since the immersion exposure method according to the present invention uses, as the immersion exposure liquid, an alicyclic hydrocarbon compound or a cyclic hydrocarbon compound containing a silicon atom in its ring structure which exhibits high hydrophobicity and exhibits a high refractive index at an exposure wavelength, elution and dissolution of a photoresist film or its upper layer film component (particularly hydrophilic component) can be prevented, defects during formation of a resist pattern and erosion of a lens can be prevented, deterioration of the pattern shape can be reduced, and the resolution and depth of focus can be improved.

BEST MODE FOR CARRYING OUT THE INVENTION

It is preferable that the alicyclic hydrocarbon compound or the cyclic hydrocarbon compound containing a silicon atom in its ring structure which may be used as the immersion exposure liquid be an alicyclic saturated hydrocarbon compound or a cyclic saturated hydrocarbon compound containing a silicon atom in its ring structure. When an unsaturated bond exists in the hydrocarbon compound, the immersion exposure liquid tends to absorb an exposure beam.

The alicyclic hydrocarbon compound or the cyclic hydrocarbon compound containing a silicon atom in its ring structure which may be used as the immersion exposure liquid is described below with reference to the following formulas (1-1) to (1-9).

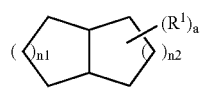

(1-1)

In the formula (1-1), $R^1$ represents an aliphatic hydrocarbon group having 1 to 10 carbon atoms, an alicyclic hydrocarbon group having 3 to 14 carbon atoms, a cyano group, a hydroxyl group, a fluorine atom, a fluorine-substituted hydrocarbon group having 1 to 10 carbon atoms, a group —Si($R^9$)$_3$, or a group —SO$_3$R$^{10}$, n1 and n2 individually represent integers from 1 to 3, a represents an integer from 0 to 10, provided that, when two or more $R^1$s exist, the $R^1$s may be the same or different, and two or more $R^1$s may be bonded to form a ring structure, and $R^9$ and $R^{10}$ represent alkyl groups having 1 to 10 carbon atoms.

As examples of the aliphatic hydrocarbon group having 1 to 10 carbon atoms represented by $R^1$, a methyl group, ethyl group, n-propyl group, and the like can be given. As examples of the ring structure formed when two or more $R^1$s are bonded, a cyclopentyl group, cyclohexyl group, and the like can be given. As examples of the alicyclic hydrocarbon group having 3 to 14 carbon atoms, a cyclohexyl group, norbornyl group, and the like can be given. As examples of the fluorine-substituted hydrocarbon group having 1 to 10 carbon atoms, a trifluoromethyl group, pentafluoroethyl group, and the like can be given. As examples of the alkyl groups having 1 to 10 carbon atoms represented by $R^9$ of the group —Si($R^9$)$_3$ and $R^{10}$ of the group —SO$_3$R$^{10}$, a methyl group, ethyl group, and the like can be given.

As the substituent $R^1$ in the formula (1-1), the aliphatic saturated hydrocarbon group having 1 to 10 carbon atoms, alicyclic saturated hydrocarbon group having 3 to 14 carbon atoms, cyano group, fluorine atom, and fluorine-substituted saturated hydrocarbon group having 1 to 10 carbon atoms are preferable due to the high transmittance of radiation with a wavelength of 193 nm.

Of these, the aliphatic saturated hydrocarbon group having 1 to 10 carbon atoms and the alicyclic saturated hydrocarbon group having 3 to 14 carbon atoms are particularly preferable, since the resulting product exhibits a higher refractive index and a small interaction with a resist and rarely causes defects due to elution of a water-soluble component in a resist or erosion of a lens material.

It is preferable that n1 and n2 be 1 to 3, and particularly preferably 1 or 2. It is preferable that a be 0, 1, or 2. It is particularly preferable that a be 0, since the refractive index for light with a wavelength of 193 nm increases, for example.

Specific examples of preferred alicyclic saturated hydrocarbon compounds of the formula (1-1) are given below. In this specification, illustration of hydrogen atoms bonded to carbon atoms forming the ring of the alicyclic saturated hydrocarbon compound is omitted.

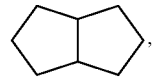

(1-1-1)

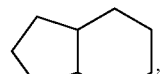

(1-1-2)

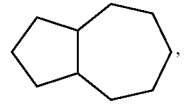

(1-1-3)

(1-1-4)

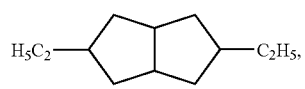

(1-1-5)

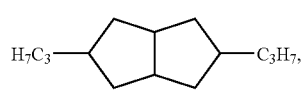

(1-1-6)

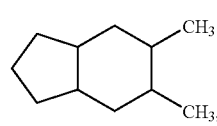

(1-1-7)

-continued
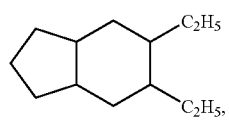 (1-1-8)
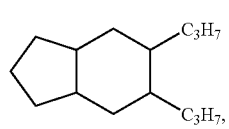 (1-1-9)
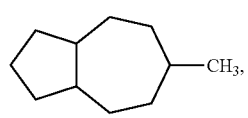 (1-1-10)
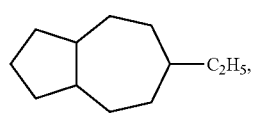 (1-1-11)
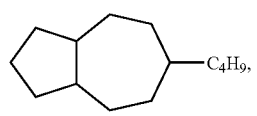 (1-1-12)
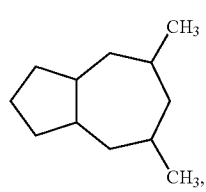 (1-1-13)
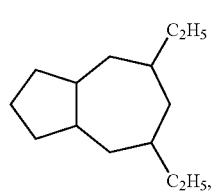 (1-1-14)
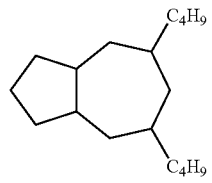 (1-1-15)
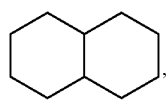 (1-1-16)
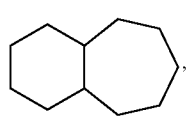 (1-1-17)
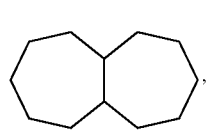 (1-1-18)
-continued
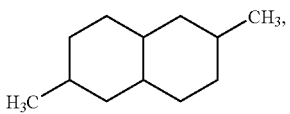 (1-1-19)
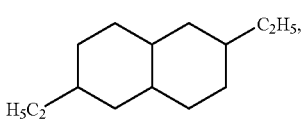 (1-1-20)
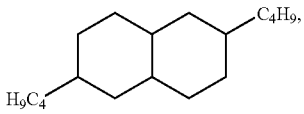 (1-1-21)
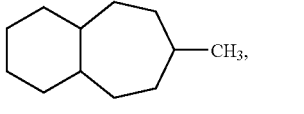 (1-1-22)
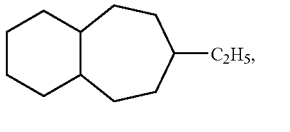 (1-1-23)
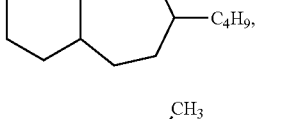 (1-1-24)
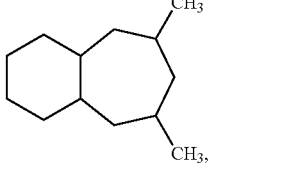 (1-1-25)
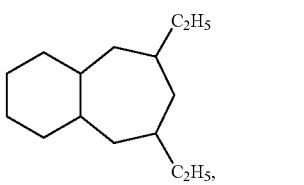 (1-1-26)
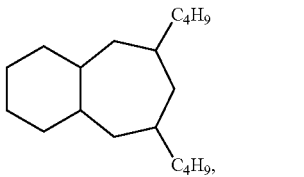 (1-1-27)
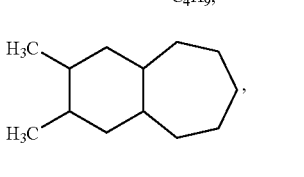 (1-1-28)
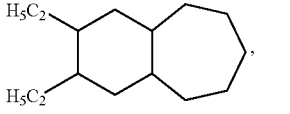 (1-1-29)

-continued
(1-1-30) 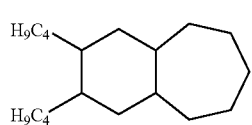
(1,1,31) 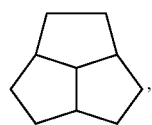
(1,1,32) 
(1,1,33) 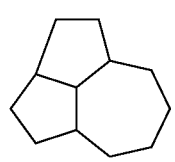
(1,1,34) 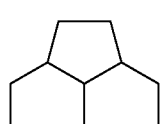
(1,1,35) 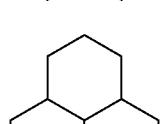
(1,1,36) 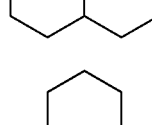
(1,1,37) 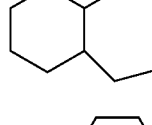
(1,1,38) 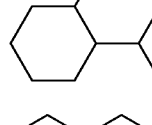
(1,1,39) 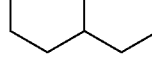
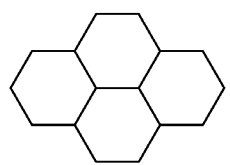
Specific examples of preferred cyano group-containing compound of the formula (1-1) are given below.
(1-1-40) 
(1-1-41) 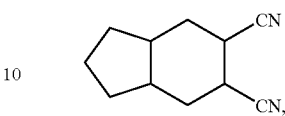
(1-1-42) 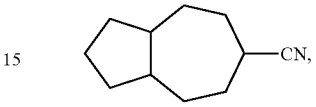
(1-1-43) 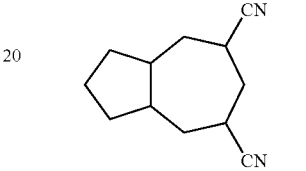
Specific examples of preferred fluorine-containing compounds of the formula (1-1) are given below.
(1-1-44) 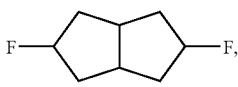
(1-1-45) 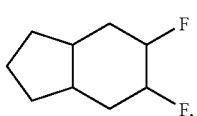
(1-1-46) 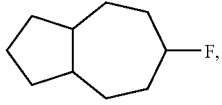
(1-1-47) 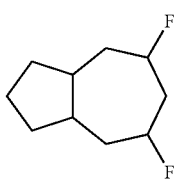
Specific examples of preferred fluorine-substituted saturated hydrocarbon compounds of the formula (1-1) are given below.
(1-1-48) 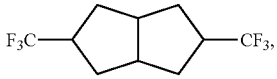
(1-1-49) 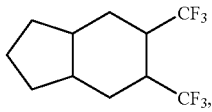

-continued

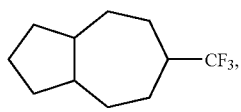
(1-1-50)

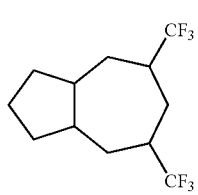
(1-1-51)

The alicyclic saturated hydrocarbon compounds are preferable among the preferred compounds of the formula (1-1). As the alicyclic saturated hydrocarbon compounds, the compounds of the following formula (2-1) are particularly preferable.

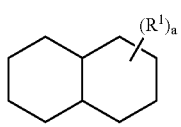
(2-1)

$R^1$ and a in the formula (2-1) are the same as $R^1$ and a in the formula (1-1).

As specific examples of the compounds of the formula (2-1), the compounds of the formulas (1-1-16), (1-1-19), (1-1-20), (1-1-21), (1-1-34), (1-1-35), (1-1-36), (1-1-37), (1-1-38), and (1-1-39) can be given.

Of these, a compound which does not have a substituent is preferable, since the refractive index for light with a wavelength of 193 nm increases, for example. As examples of particularly preferred compounds of the formula (2-1), cis-decalin and trans-decalin can be given.

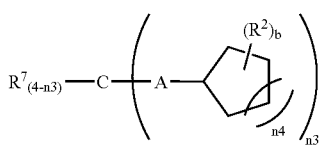
(1-2)

In the formula (1-2), A represents a single bond, a methylene group which may be replaced with an alkyl group having 1 to 10 carbon atoms, or an alkylene group having 2 to 14 carbon atoms which may be replaced with an alkyl group having 1 to 10 carbon atoms, $R^2$ represents an aliphatic hydrocarbon group having 1 to 10 carbon atoms, an alicyclic hydrocarbon group having 3 to 14 carbon atoms, a cyano group, a hydroxyl group, a fluorine atom, a fluorine-substituted hydrocarbon group having 1 to 10 carbon atoms, a group —Si($R^9$)$_3$, or a group —SO$_3$R$^{10}$, $R^7$ represents a hydrogen atom, an alkyl group having 1 to 10 carbon atoms, a cyano group, a hydroxyl group, a fluorine atom, a fluorine-substituted alkyl group having 1 to 10 carbon atoms, or a group —Si($R^9$)$_3$, n3 represents an integer from 2 to 4, n4 represents an integer from 1 to 3, b represents an integer from 0 to 6, provided that, when two or more $R^2$s or $R^7$s exist, the $R^2$s may be the same or different, and two or more $R^2$s may be bonded to form a ring structure, and $R^9$ and $R^{10}$ represent alkyl groups having 1 to 10 carbon atoms.

As examples of the methylene group which may be replaced with an alkyl group having 1 to 10 carbon atoms or the alkylene group having 2 to 14 carbon atoms which may be replaced with an alkyl group having 1 to 10 carbon atoms represented by A, an ethylene group, n-propylene group, and the like can be given.

$R^2$ is the same as $R^1$ in the formula (1-1).

As the substituent $R^2$ in the formula (1-2), the aliphatic saturated hydrocarbon group having 1 to 10 carbon atoms, alicyclic saturated hydrocarbon group having 3 to 14 carbon atoms, cyano group, fluorine atom, and fluorine-substituted saturated hydrocarbon group having 1 to 10 carbon atoms are preferable due to the high transmittance of radiation with a wavelength of 193 nm.

Of these, the aliphatic saturated hydrocarbon group having 1 to 10 carbon atoms and the alicyclic saturated hydrocarbon group having 3 to 14 carbon atoms are preferable for the same reason as for $R^1$ in the formula (1-1).

It is preferable that n3 be 2 to 4, and particularly preferably 2 or 3. It is preferable that n4 be 1 to 3, and particularly preferably 1 or 2. It is preferable that b be 0, 1, or 2. It is particularly preferable that b be 0, since the refractive index for light with a wavelength of 193 nm increases, for example. Specific examples of preferred compounds of the formula (1-2) are given below.

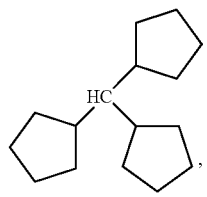
(1-2-1)

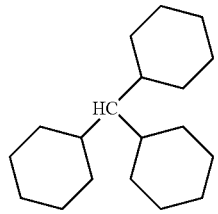
(1-2-2)

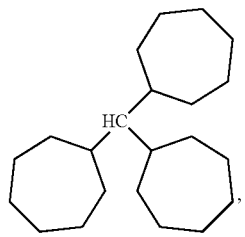
(1-2-3)

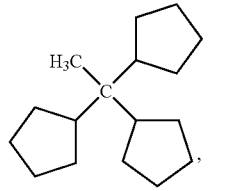
(1-2-4)

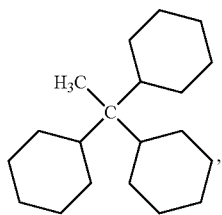 (1-2-5)
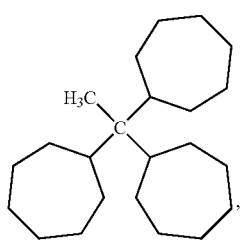 (1-2-6)
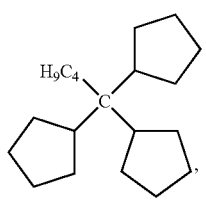 (1-2-7)
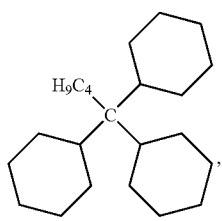 (1-2-8)
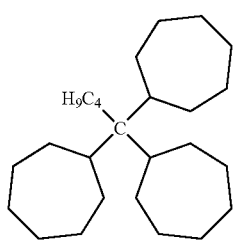 (1-2-9)
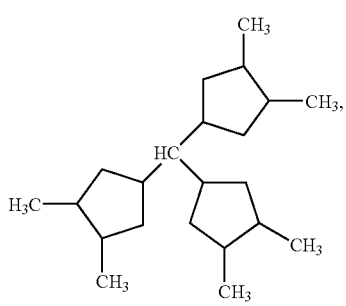 (1-2-10)
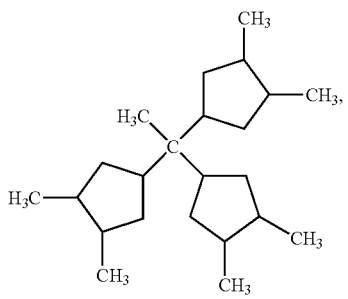 (1-2-11)
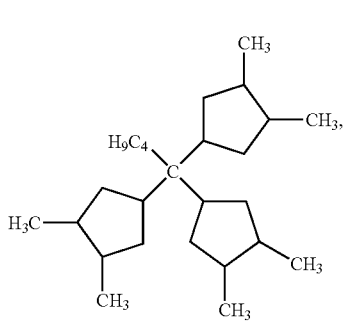 (1-2-12)
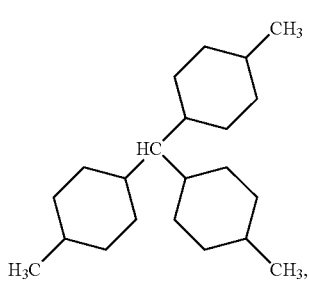 (1-2-13)
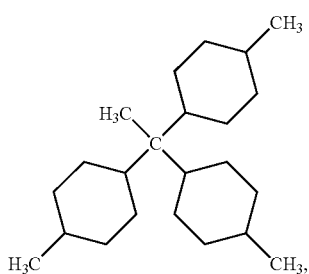 (1-2-14)
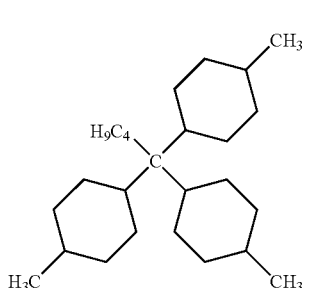 (1-2-15)

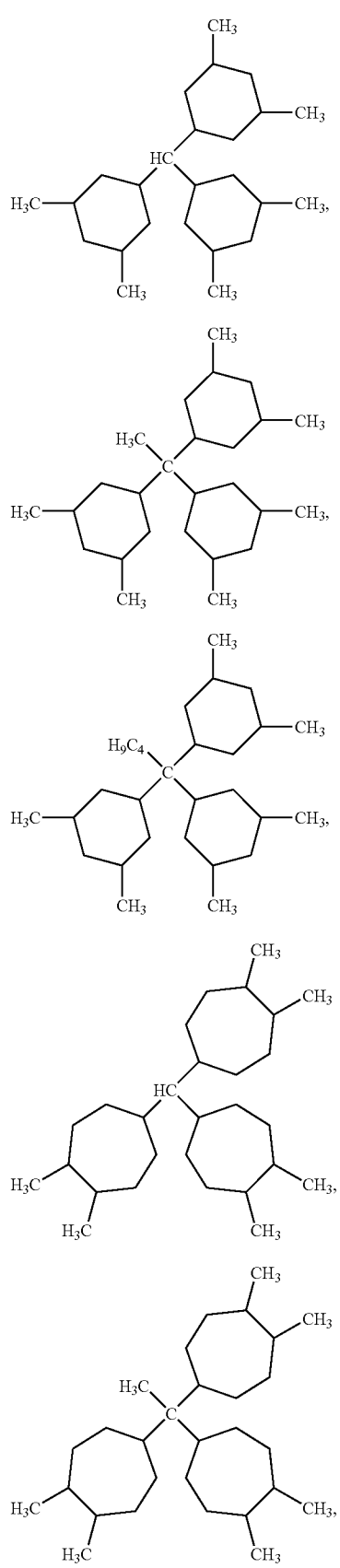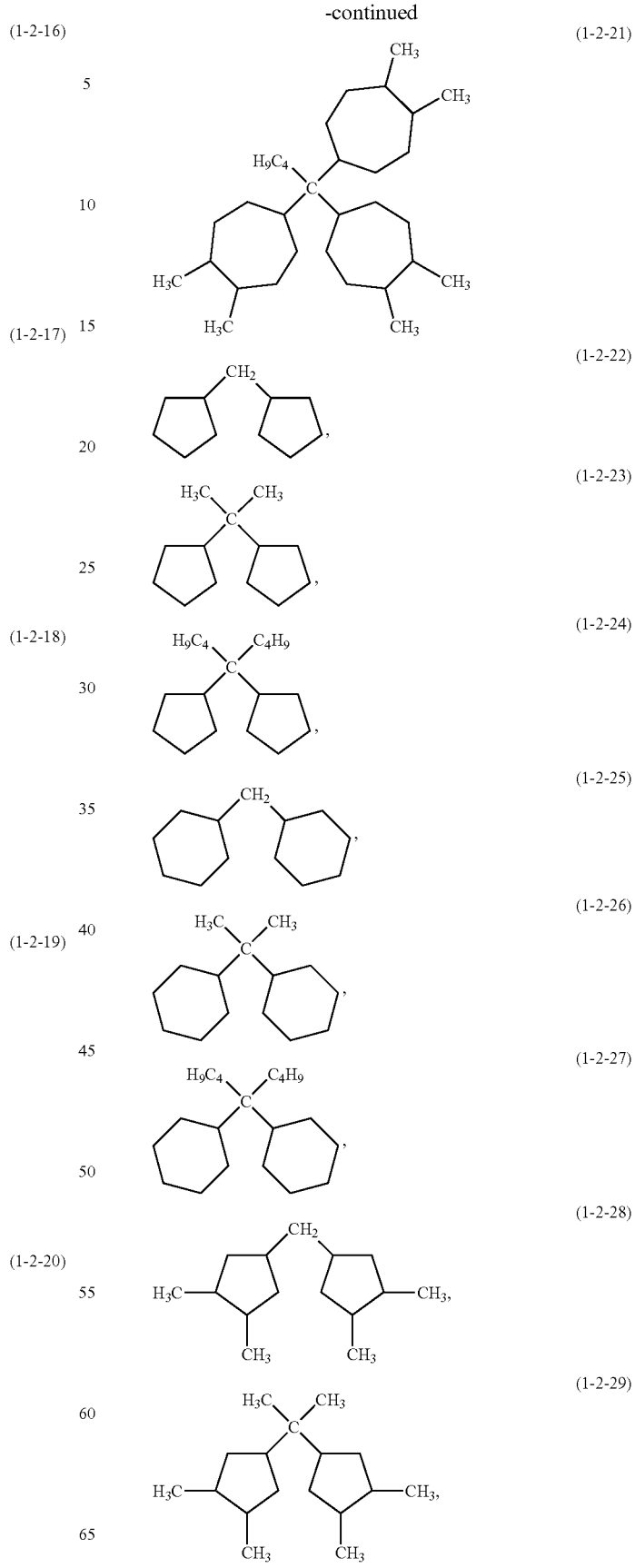

-continued
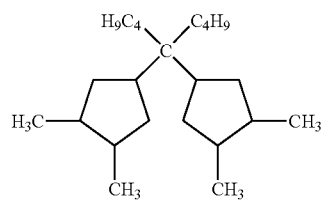
(1-2-30)
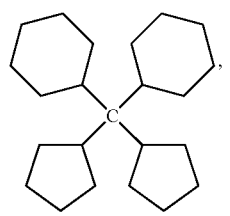
(1-2-31)
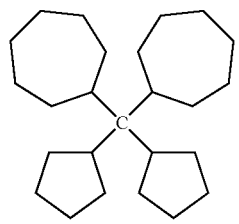
(1-2-32)
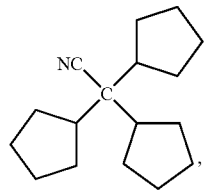
(1-2-33)
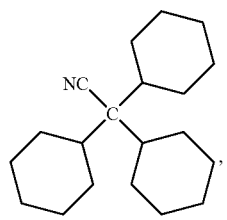
(1-2-34)
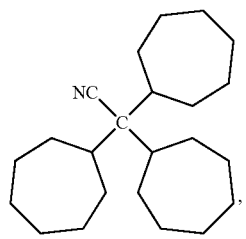
(1-2-35)
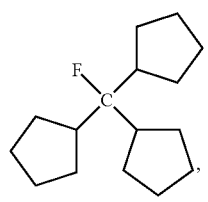
(1-2-36)
-continued
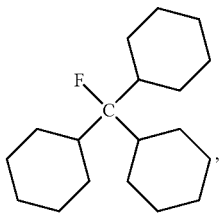
(1-2-37)
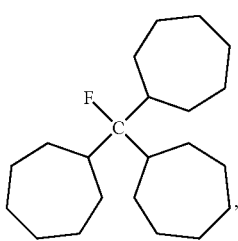
(1-2-38)
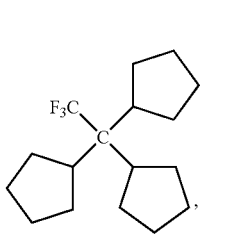
(1-2-39)
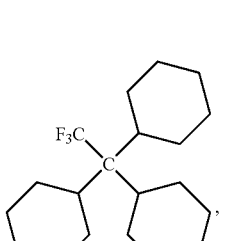
(1-2-40)
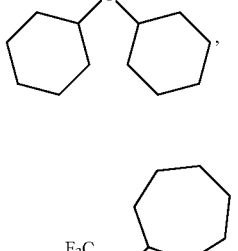
(1-2-41)
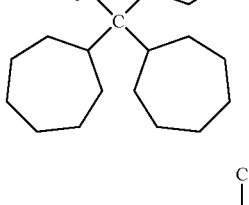
(1-2-42)
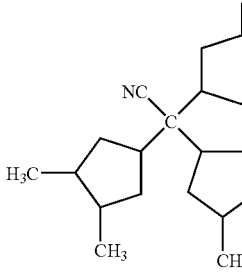

-continued
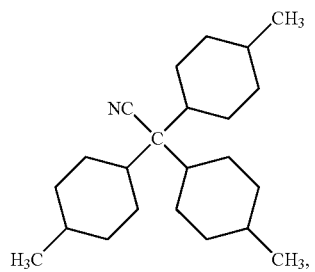 (1-2-43)
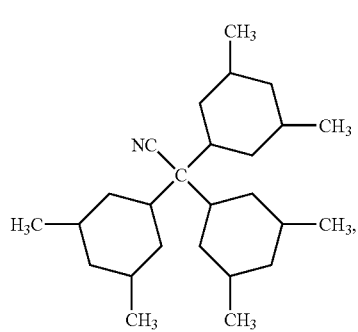 (1-2-44)
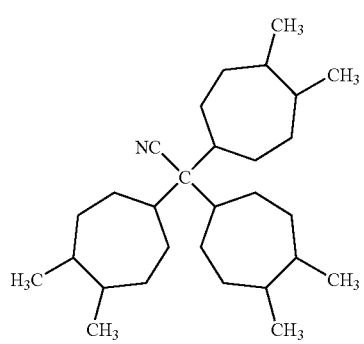 (1-2-45)
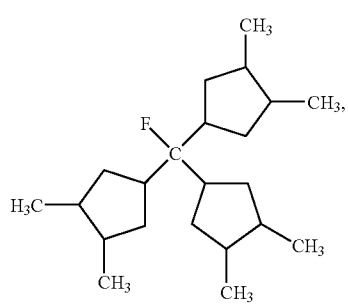 (1-2-46)
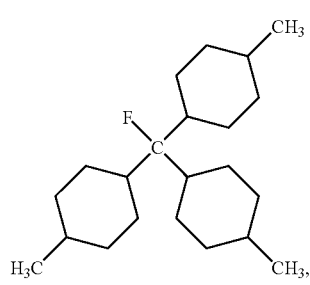 (1-2-47)
-continued
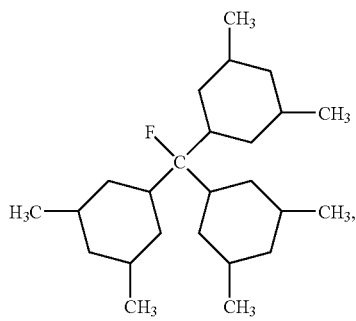 (1-2-48)
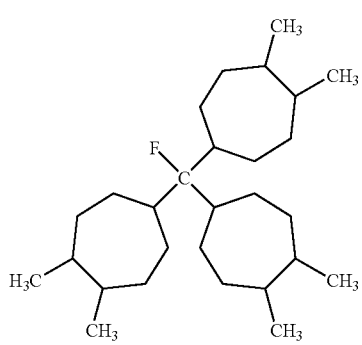 (1-2-49)
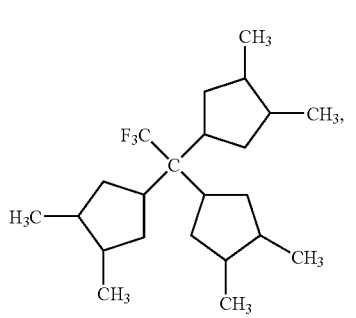 (1-2-50)
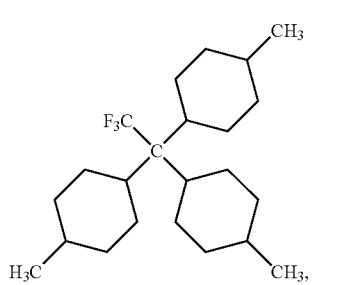 (1-2-51)
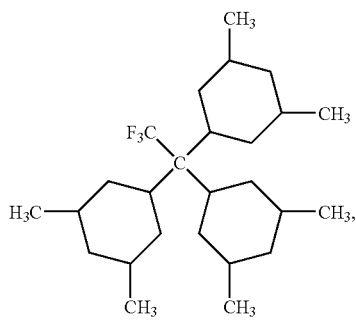 (1-2-52)

-continued
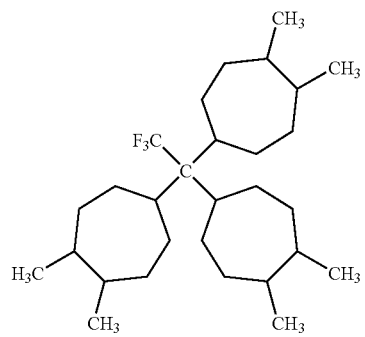 (1-2-53)
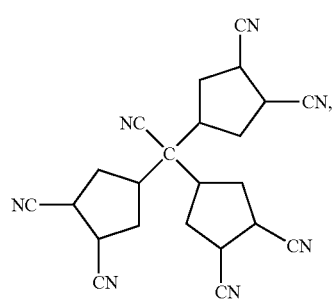 (1-2-54)
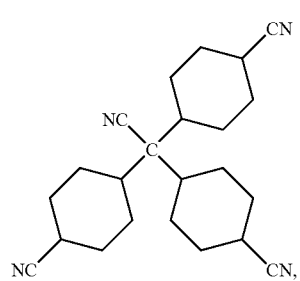 (1-2-55)
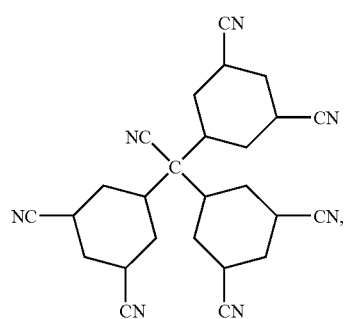 (1-2-56)
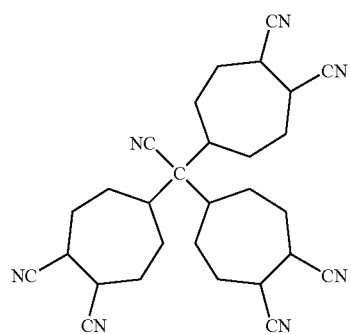 (1-2-57)
-continued
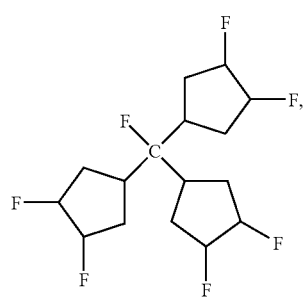 (1-2-58)
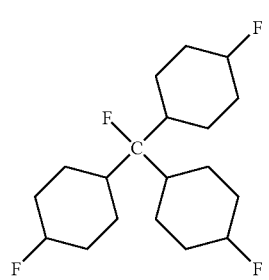 (1-2-59)
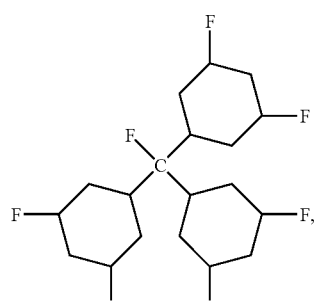 (1-2-60)
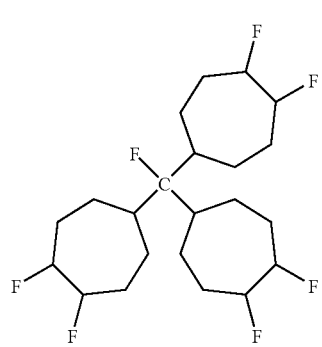 (1-2-61)
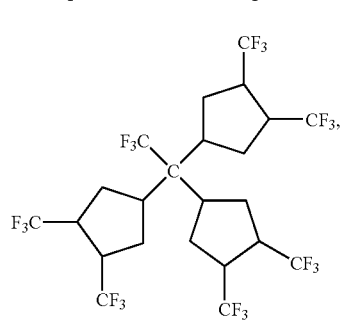 (1-2-62)

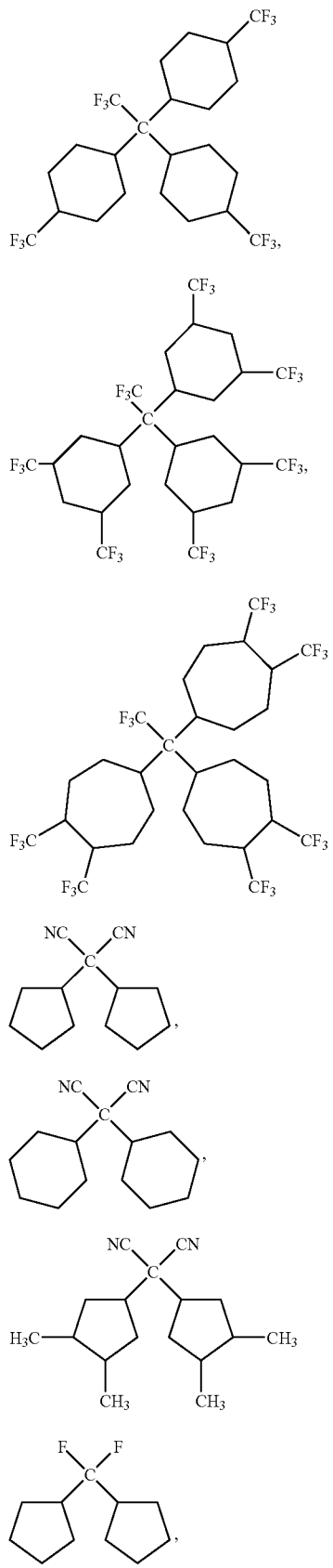
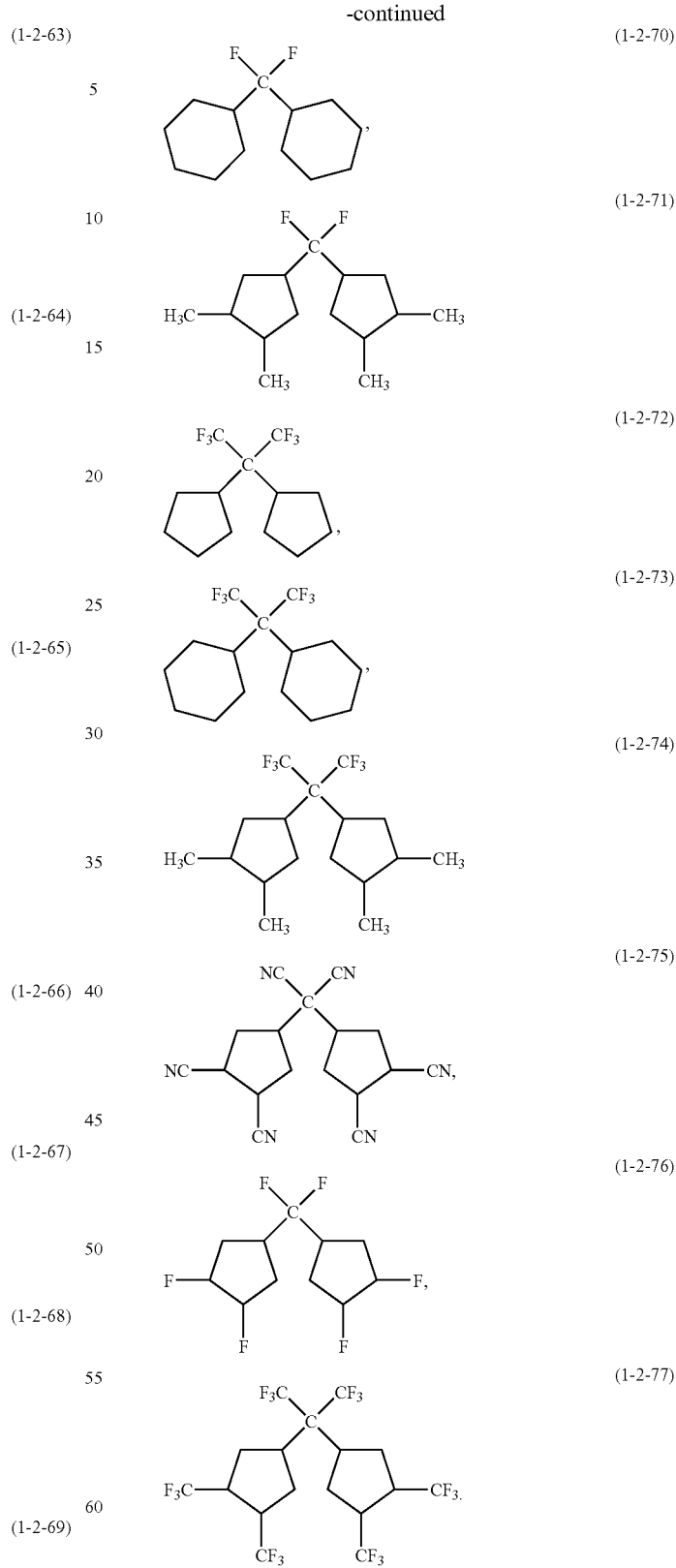
As examples of particularly preferred compounds of the formula (1-2), 1,1,1-tricycloheptylmethane and 1,1,1-tricyclopentylmethane can be given.

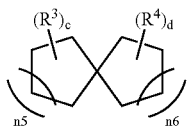
(1-3)

In the formula (1-3), $R^3$ and $R^4$ represent an aliphatic hydrocarbon group having 1 to 10 carbon atoms, an alicyclic hydrocarbon group having 3 to 14 carbon atoms, a cyano group, a hydroxyl group, a fluorine atom, a fluorine-substituted hydrocarbon group having 1 to 10 carbon atoms, a group $-Si(R^9)_3$, or a group $-SO_3R^{10}$, provided that, when two or more $R^3$s and $R^4$s exist, the $R^3$s and the $R^4$s may be respectively the same or different, and two or more $R^3$s and $R^4$s may respectively form ring structures or may be bonded to form a ring structure, n5 and n6 represent integers from 1 to 3, c and d represent integers from 0 to 8, and $R^9$ and $R^{10}$ represent alkyl groups having 1 to 10 carbon atoms.

$R^3$ and $R^4$ are the same as $R^1$ in the formula (1-1).

As the substituents $R^3$ and $R^4$ in the formula (1-3), the aliphatic saturated hydrocarbon group having 1 to 10 carbon atoms, alicyclic saturated hydrocarbon group having 3 to 14 carbon atoms, cyano group, fluorine atom, and fluorine-substituted saturated hydrocarbon group having 1 to 10 carbon atoms are preferable due to the high transmittance of radiation with a wavelength of 193 nm.

Of these, the aliphatic saturated hydrocarbon group having 1 to 10 carbon atoms and the alicyclic saturated hydrocarbon group having 3 to 14 carbon atoms are preferable for the same reason as for $R^1$ in the formula (1-1).

It is preferable that n5 and n6 be 1 to 3, and particularly preferably 1 or 2. It is preferable that c and d be 0, 1, or 2. It is particularly preferable that c and d be 0, since the refractive index for light with a wavelength of 193 nm increases, for example. Specific examples of preferred compounds of the formula (1-3) are given below.

(1-3-1)

(1-3-2)

(1-3-3)

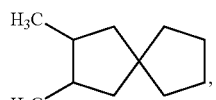
(1-3-4)

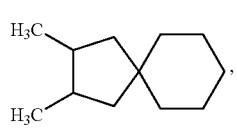
(1-3-5)

-continued

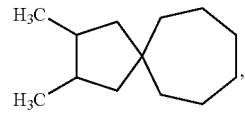
(1-3-6)

(1-3-7)

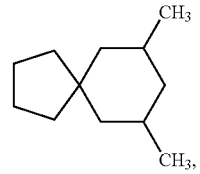
(1-3-8)

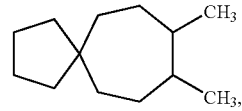
(1-3-9)

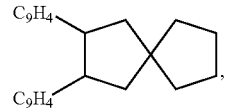
(1-3-10)

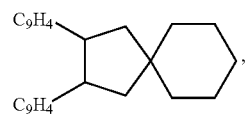
(1-3-11)

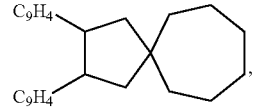
(1-3-12)

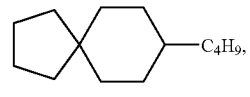
(1-3-13)

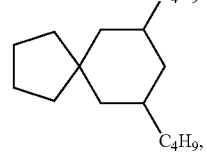
(1-3-14)

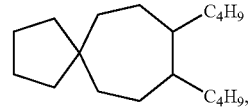
(1-3-15)

(1-3-16)

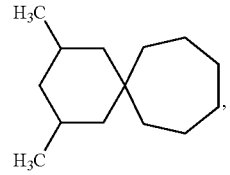
(1-3-17)

-continued
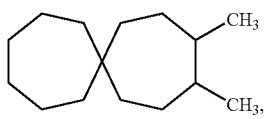 (1-3-18)
 (1-3-19)
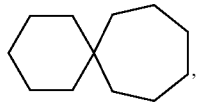 (1-3-20)
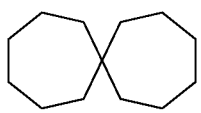 (1-3-21)
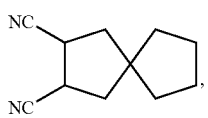 (1-3-22)
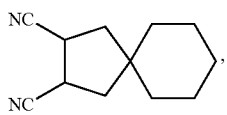 (1-3-23)
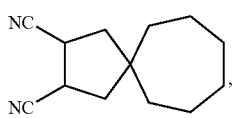 (1-3-24)
 (1-3-25)
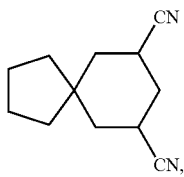 (1-3-26)
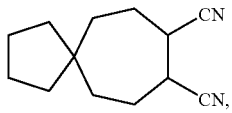 (1-3-27)
 (1-3-28)
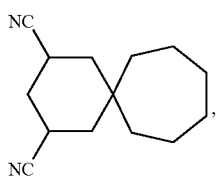 (1-3-29)
-continued
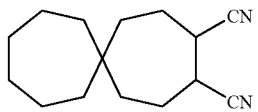 (1-3-30)
 (1-3-31)
 (1-3-32)
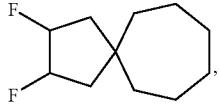 (1-3-33)
 (1-3-34)
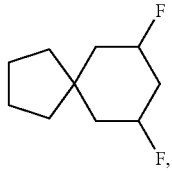 (1-3-35)
 (1-3-36)
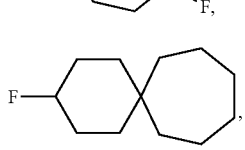 (1-3-37)
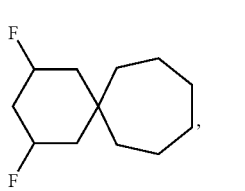 (1-3-38)
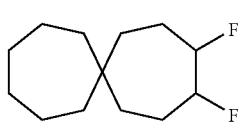 (1-3-39)
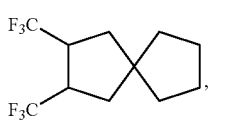 (1-3-40)
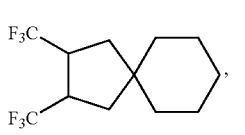 (1-3-41)

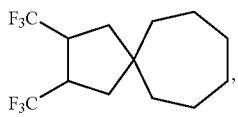 (1-3-42)

 (1-3-43)

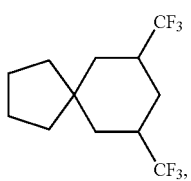 (1-3-44)

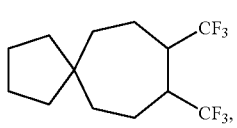 (1-3-45)

 (1-3-46)

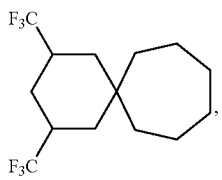 (1-3-47)

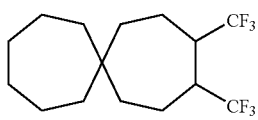 (1-3-48)

As an example of the preferred compound of the formula (1-3), spiro[5.5]undecane can be given.

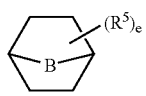 (1-4)

(a)

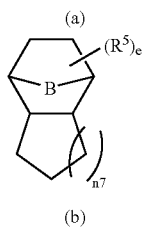

(b)

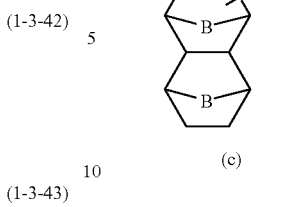

(c)

In (a), (b), and (c) of the formula (1-4), B represents a methylene group or an ethylene group, $R^5$ represents an aliphatic hydrocarbon group having 1 to 10 carbon atoms, an alicyclic hydrocarbon group having 3 to 14 carbon atoms, a cyano group, a hydroxyl group, a fluorine atom, a fluorine-substituted hydrocarbon group having 1 to 10 carbon atoms, a group —Si($R^9$)$_3$, or a group —SO$_3R^{10}$, provided that, when two or more $R^5$s exist, the $R^5$s may be the same or different, and two or more $R^5$s may be bonded to form a ring structure, e represents an integer from 0 to 10, n7 represents an integer from 1 to 3, and $R^9$ and $R^{10}$ represent alkyl groups having 1 to 10 carbon atoms.

$R^5$ is the same as $R^1$ in the formula (1-1).

As the substituent $R^5$ in the formula (1-4), the aliphatic saturated hydrocarbon group having 1 to 10 carbon atoms, alicyclic saturated hydrocarbon group having 3 to 14 carbon atoms, cyano group, fluorine atom, and fluorine-substituted saturated hydrocarbon group having 1 to 10 carbon atoms are preferable due to the high transmittance of radiation with a wavelength of 193 nm.

Of these, the aliphatic saturated hydrocarbon group having 1 to 10 carbon atoms and the alicyclic saturated hydrocarbon group having 3 to 14 carbon atoms are preferable for the same reason as for $R^1$ in the formula (1-1).

It is preferable that e be 0, 1, or 2. It is preferable that n7 be 1 to 3, and particularly preferably 1 or 2. It is particularly preferable that e be 0, since the refractive index for light with a wavelength of 193 nm increases, for example.

Specific examples of preferred compounds of the formula (1-4) are given below.

 (1-4-1)

 (1-4-2)

 (1-4-3)

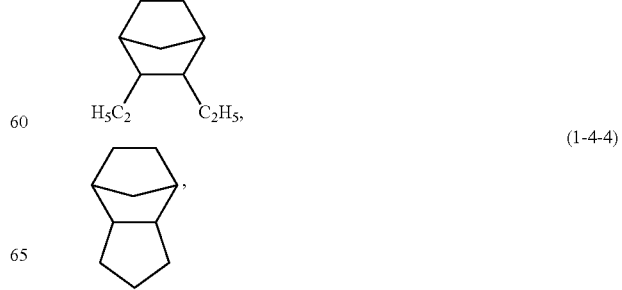 (1-4-4)

-continued
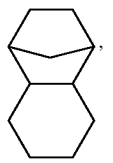 (1-4-5)
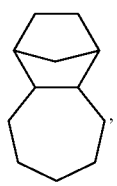 (1-4-6)
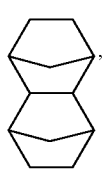 (1-4-7)
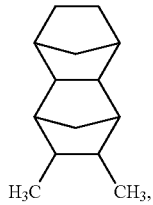 (1-4-8)
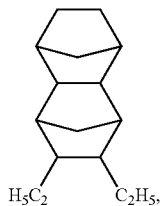 (1-4-9)
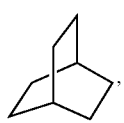 (1-4-10)
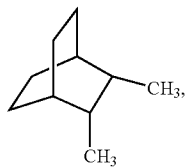 (1-4-11)
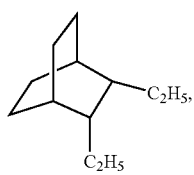 (1-4-12)
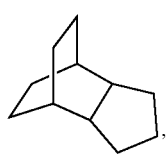 (1-4-13)
-continued
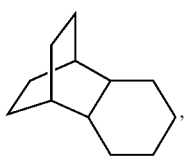 (1-4-14)
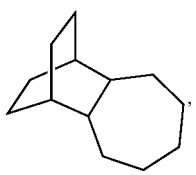 (1-4-15)
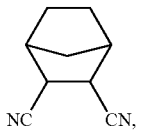 (1-4-16)
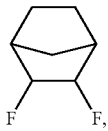 (1-4-17)
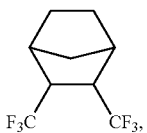 (1-4-18)
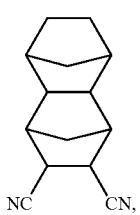 (1-4-19)
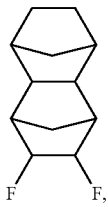 (1-4-20)
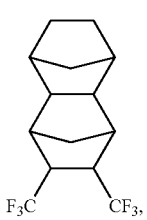 (1-4-21)
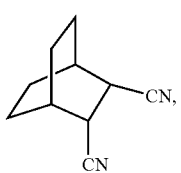 (1-4-22)

-continued (1-4-23)
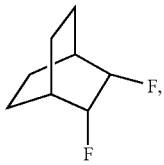

(1-4-24)
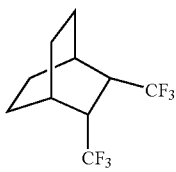

As examples of preferred compounds of the formula (1-4), compounds of the following formulas (2-2) and (2-2') can be given.

(2-2)
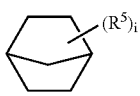

(2-2')
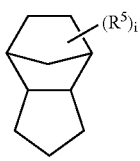

In the formulas (2-2) and (2-2'), $R^5$ is the same as $R^5$ in the formula (1-4), and i is preferably 0, 1, or 2. It is particularly preferable that i be 0 for the same reason as for a in the formula (1-1).

As specific examples of the preferred compounds of the formulas (2-2) and (2-2'), the compounds of the above formulas (1-4-1) to (1-4-6) can be given.

As a particularly preferred example of the compounds of the formulas (2-2) and (2-2'), exo-tetrahydrodicyclopentadiene can be given.

(1-5)
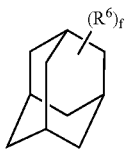

In the formula (1-5), $R^6$ represents an aliphatic hydrocarbon group having 1 to 10 carbon atoms, an alicyclic hydrocarbon group having 3 to 14 carbon atoms, a cyano group, a hydroxyl group, a fluorine atom, a fluorine-substituted hydrocarbon group having 1 to 10 carbon atoms, a group —Si($R^9$)$_3$, or a group —SO$_3$R$^{10}$, f represents an integer from 0 to 10, provided that, when two or more $R^6$s exist, the $R^6$s may be the same or different, and $R^9$ and $R^{10}$ represent alkyl groups having 1 to 10 carbon atoms.

$R^6$ is the same as $R^1$ in the formula (1-1).

As the substituent $R^6$ in the formula (1-5), the aliphatic saturated hydrocarbon group having 1 to 10 carbon atoms, alicyclic saturated hydrocarbon group having 3 to 14 carbon atoms, cyano group, fluorine atom, and fluorine-substituted saturated hydrocarbon group having 1 to 10 carbon atoms are preferable due to the high transmittance of radiation with a wavelength of 193 nm.

Of these, the aliphatic saturated hydrocarbon group having 1 to 10 carbon atoms and the alicyclic saturated hydrocarbon group having 3 to 14 carbon atoms are preferable for the same reason as for $R^1$ in the formula (1-1).

f is preferably 1 or 2. It is preferable that the substituent be located at a bridgehead position.

As examples of preferred compounds of the formula (1-5), compounds of the following formulas can be given.

(1-5-1)
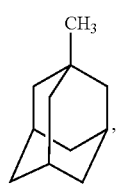

(1-5-2)
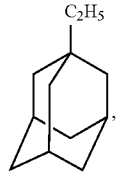

(1-5-3)
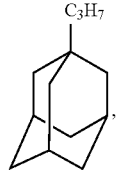

(1-5-4)
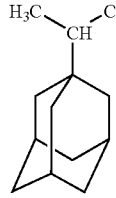

(1-5-5)
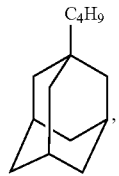

(1-5-6)
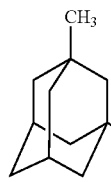

(1-5-7)

-continued

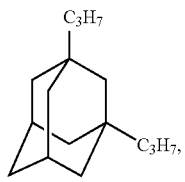
(1-5-8)

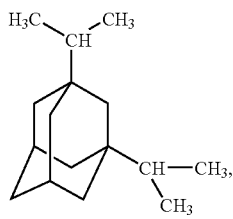
(1-5-9)

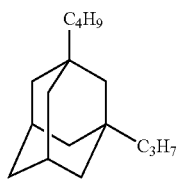
(1-5-10)

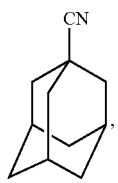
(1-5-11)

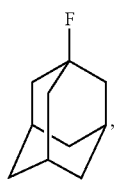
(1-5-12)

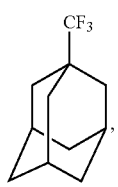
(1-5-13)

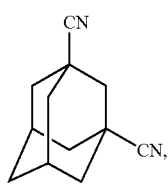
(1-5-14)

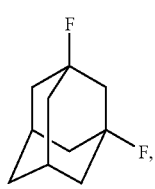
(1-5-15)

-continued

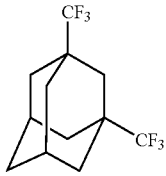
(1-5-16)

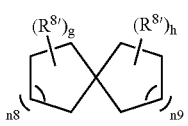
(1-6)

In the formula (1-6), $R^8$ and $R^{8'}$ represent an aliphatic hydrocarbon group having 1 to 10 carbon atoms, an alicyclic hydrocarbon group having 3 to 14 carbon atoms, a cyano group, a hydroxyl group, a fluorine atom, a fluorine-substituted hydrocarbon group having 1 to 10 carbon atoms, a group —Si($R^9$)$_3$, or a group —SO$_3R^{10}$, g and h individually represent integers from 0 to 6, n8 and n9 represent integers from 1 to 3, and $R^9$ and $R^{10}$ represent alkyl groups having 1 to 10 carbon atoms.

$R^8$ and $R^{8'}$ are the same as $R^1$ in the formula (1-1).

As the substituents $R^8$ and $R^{8'}$ in the formula (1-6), the aliphatic hydrocarbon group saturated having 1 to 10 carbon atoms, alicyclic saturated hydrocarbon group having 3 to 14 carbon atoms, cyano group, fluorine atom, and fluorine-substituted saturated hydrocarbon group having 1 to 10 carbon atoms are preferable due to the high transmittance of radiation with a wavelength of 193 nm.

Of these, the aliphatic saturated hydrocarbon group having 1 to 10 carbon atoms and the alicyclic saturated hydrocarbon group having 3 to 14 carbon atoms are preferable for the same reason as for $R^1$ in the formula (1-1).

It is preferable that g and h be 0, 1, or 2. It is preferable that n8 and n9 be 1 to 3, and particularly preferably 1 or 2.

Specific examples of preferred compounds of the formula (1-6) are given below.

(1-6-1)

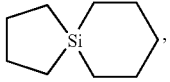
(1-6-2)

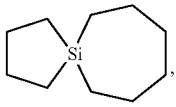
(1-6-3)

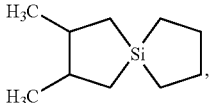
(1-6-4)

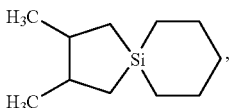
(1-6-5)

-continued
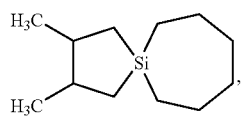 (1-6-6)
 (1-6-7)
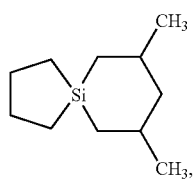 (1-6-8)
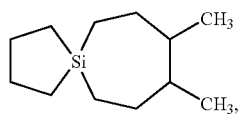 (1-6-9)
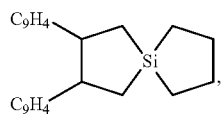 (1-6-10)
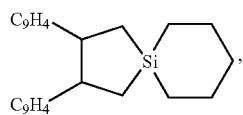 (1-6-11)
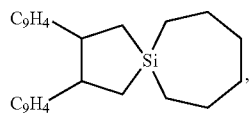 (1-6-12)
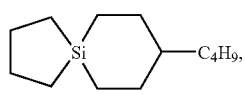 (1-6-13)
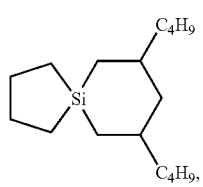 (1-6-14)
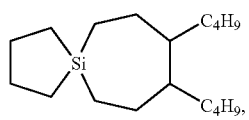 (1-6-15)
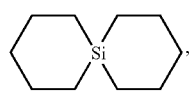 (1-6-16)
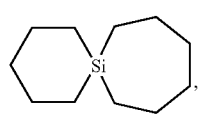 (1-6-17)
-continued
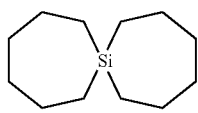 (1-6-18)
 (1-6-19)
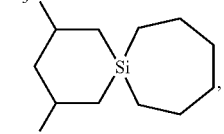 (1-6-20)
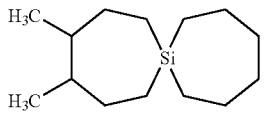 (1-6-21)
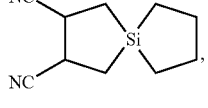 (1-6-22)
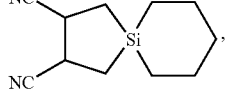 (1-6-23)
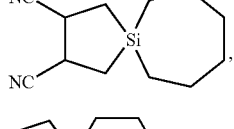 (1-6-24)
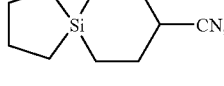 (1-6-25)
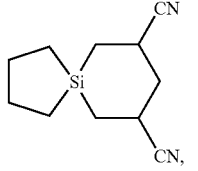 (1-6-26)
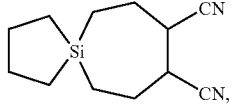 (1-6-27)
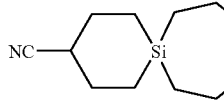 (1-6-28)
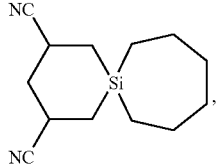 (1-6-29)

-continued (1-6-30) 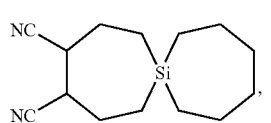

(1-6-31) 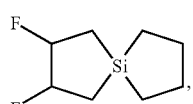

(1-6-32) 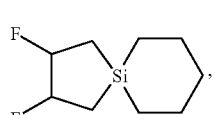

(1-6-33) 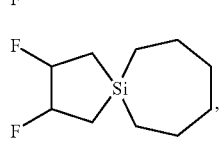

(1-6-34) 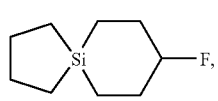

(1-6-35) 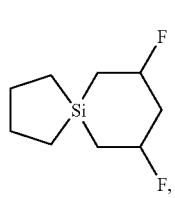

(1-6-36) 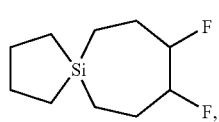

(1-6-37) 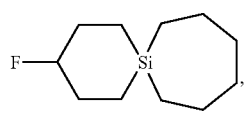

(1-6-38) 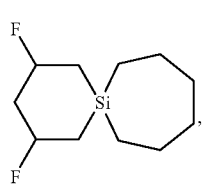

(1-6-39) 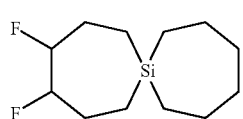

(1-6-40) 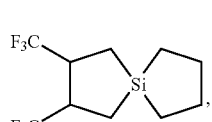

(1-6-41) 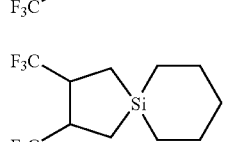

-continued (1-6-42) 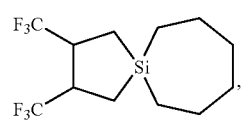

(1-6-43) 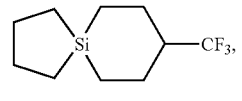

(1-6-44) 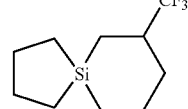

(1-6-45) 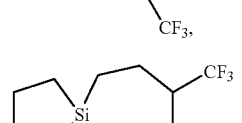

(1-6-46) 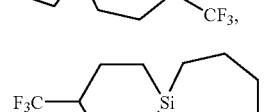

(1-6-47) 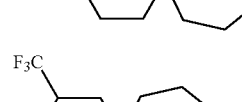

(1-6-48) 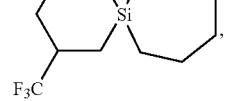

As an example of the preferred compound of the formula (1-6), 5-silacyclo[4,4]nonane can be given.

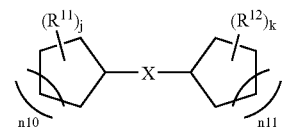

(1-7)

In the formula (1-7), $R^{11}$ and $R^{12}$ represent an aliphatic hydrocarbon group having 1 to 10 carbon atoms, an alicyclic hydrocarbon group having 3 to 14 carbon atoms, a cyano group, a hydroxyl group, a fluorine atom, a fluorine-substituted hydrocarbon group having 1 to 10 carbon atoms, a group —Si($R^9$)$_3$, or a group —SO$_3$R$^{10}$, n10 and n11 individually represent integers from 1 to 3, j and k represent integers from 0 to 6, provided that, when two or more $R^{11}$s and $R^{12}$s exist, the $R^{11}$s and the $R^{12}$s may be the same or different, and two or more $R^{11}$s may be bonded to form a ring structure or two or more $R^{12}$s may be bonded to form a ring structure, X represents a single bond, a divalent aliphatic hydrocarbon group having 2 to 10 carbon atoms, or a divalent alicyclic hydrocarbon group having 3 to 14 carbon atoms, and $R^9$ and $R^{10}$ represent alkyl groups having 1 to 10 carbon atoms.

The aliphatic hydrocarbon group having 1 to 10 carbon atoms, alicyclic hydrocarbon group having 3 to 14 carbon atoms, fluorine-substituted hydrocarbon group having 1 to 10 carbon atoms, group —Si(R$^9$)$_3$, and group —SO$_3$R$^{10}$ represented by R$^{11}$ and R$^{12}$ are the same as the aliphatic hydrocarbon group, alicyclic hydrocarbon group, fluorine-substituted hydrocarbon group, group —Si(R$^9$)$_3$, and group —SO$_3$R$^{10}$ in the formula (1-1).

As the substituents R$^{11}$ and R$^{12}$ in the formula (1-7), the aliphatic saturated hydrocarbon group having 1 to 10 carbon atoms, alicyclic saturated hydrocarbon group having 3 to 14 carbon atoms, cyano group, fluorine atom, and fluorine-substituted saturated hydrocarbon group having 1 to 10 carbon atoms are preferable due to the high transmittance of radiation with a wavelength of 193 nm.

As examples of the divalent aliphatic hydrocarbon group having 2 to 10 carbon atoms represented by X, an ethylene group and propylene group can be given. As examples of the divalent alicyclic hydrocarbon group having 3 to 14 carbon atoms represented by X, divalent groups derived from cyclopentane, cyclohexane, and the like can be given.

In the formula (1-7), X is preferably a single bond. Specific examples of preferred compounds of the formula (1-7) are given below.

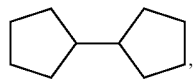
(1-7-1)

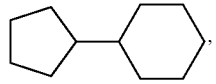
(1-7-2)

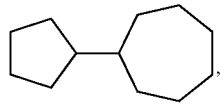
(1-7-3)

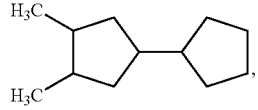
(1-7-4)

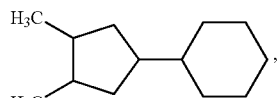
(1-7-5)

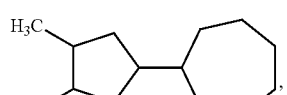
(1-7-6)

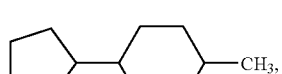
(1-7-7)

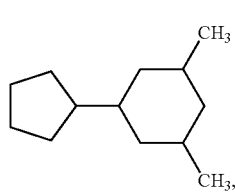
(1-7-8)

-continued

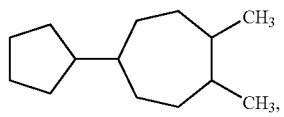
(1-7-9)

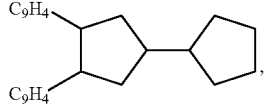
(1-7-10)

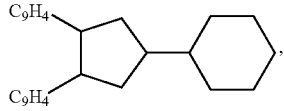
(1-7-11)

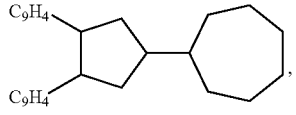
(1-7-12)

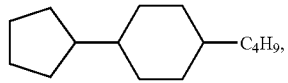
(1-7-13)

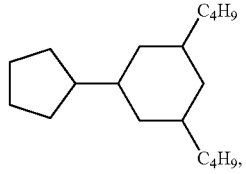
(1-7-14)

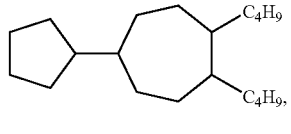
(1-7-15)

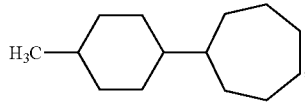
(1-7-16)

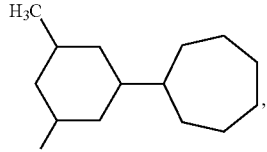
(1-7-17)

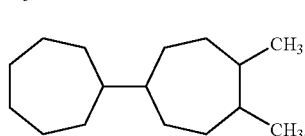
(1-7-18)

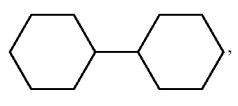
(1-7-19)

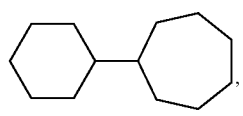
(1-7-20)

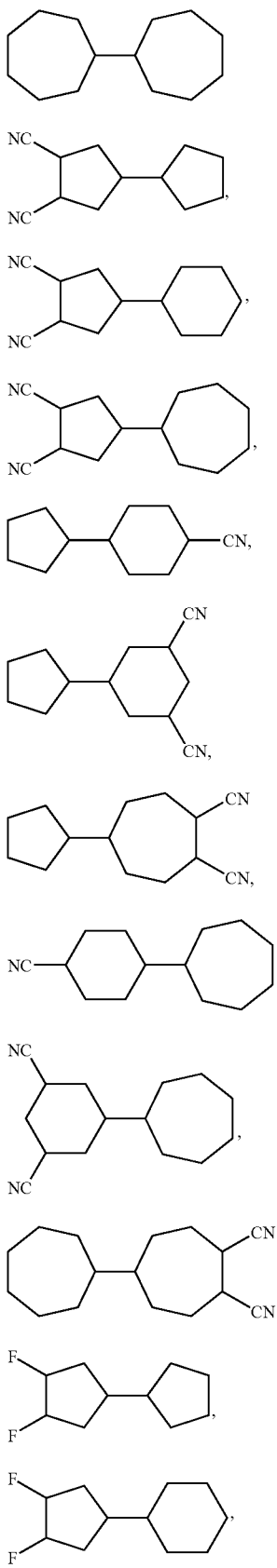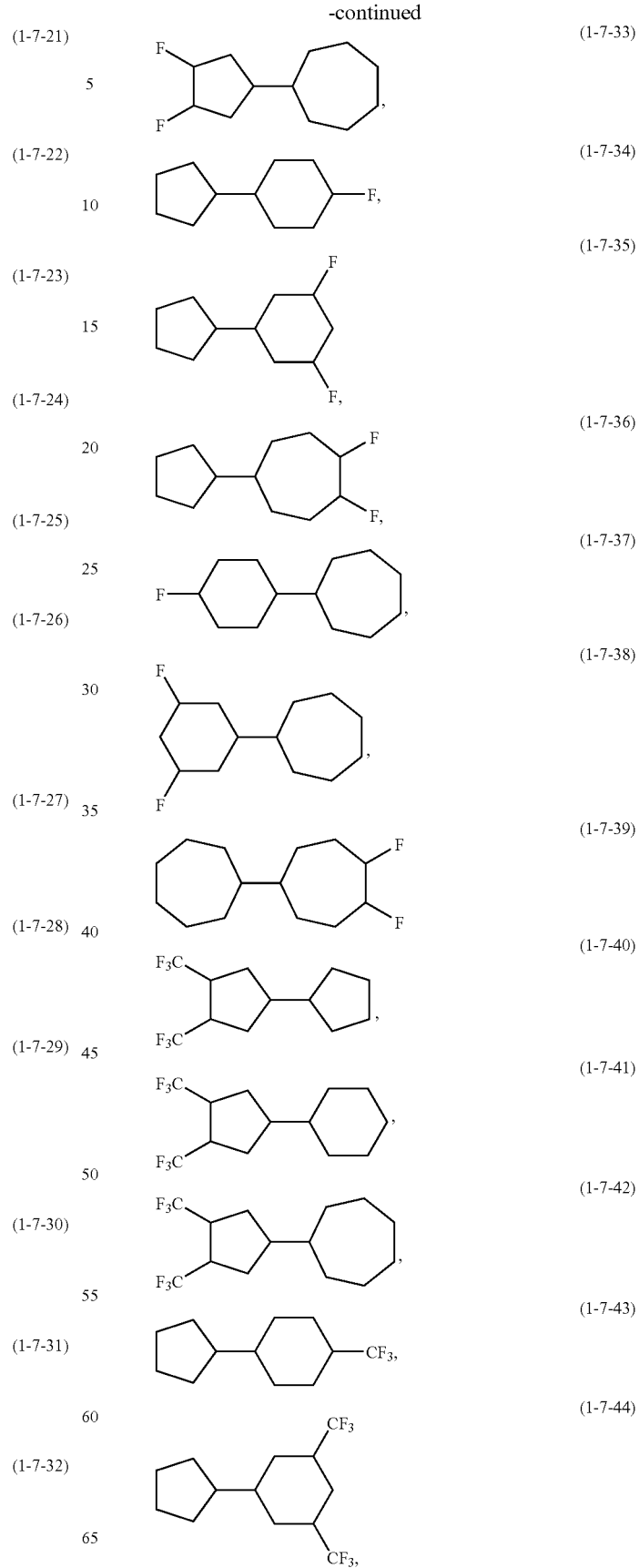

-continued
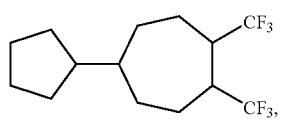 (1-7-45)
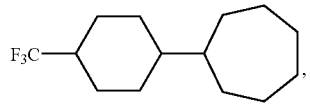 (1-7-46)
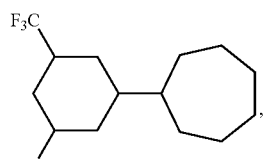 (1-7-47)
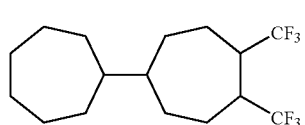 (1-7-48)
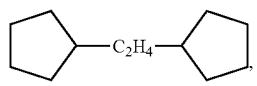 (1-7-49)
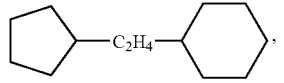 (1-7-50)
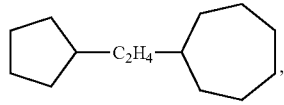 (1-7-51)
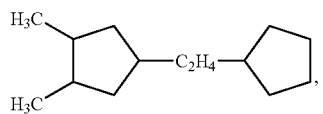 (1-7-52)
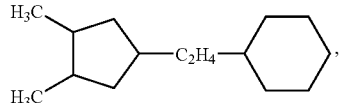 (1-7-53)
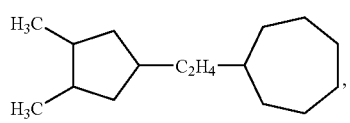 (1-7-54)
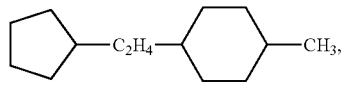 (1-7-55)
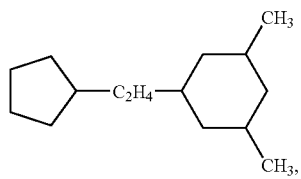 (1-7-56)
-continued
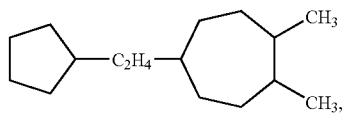 (1-7-57)
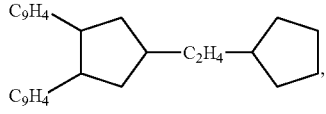 (1-7-58)
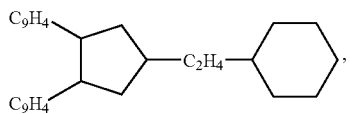 (1-7-59)
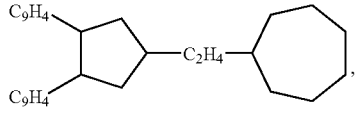 (1-7-60)
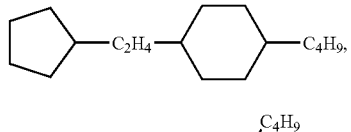 (1-7-61)
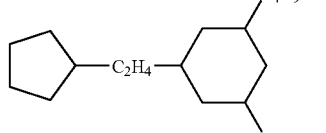 (1-7-62)
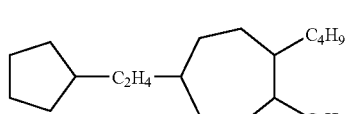 (1-7-63)
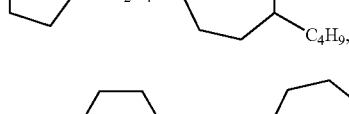 (1-7-64)
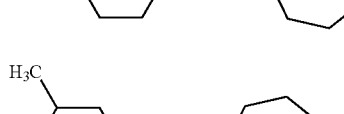 (1-7-65)
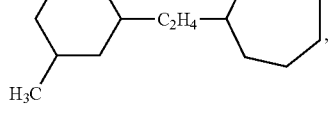 (1-7-66)
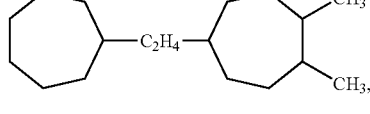 (1-7-66)
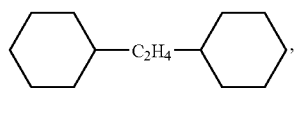 (1-7-67)
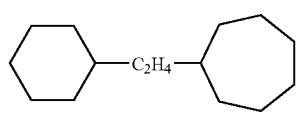 (1-7-68)

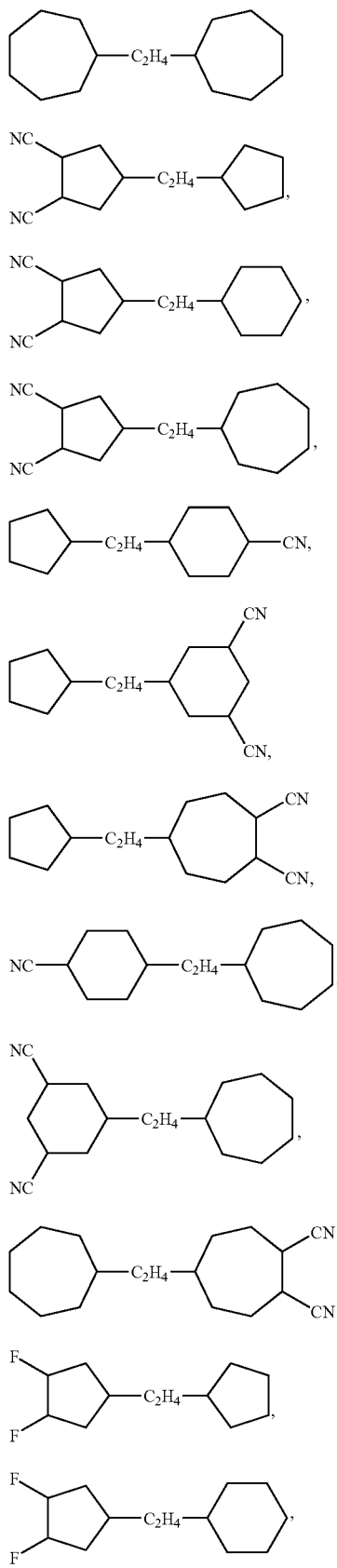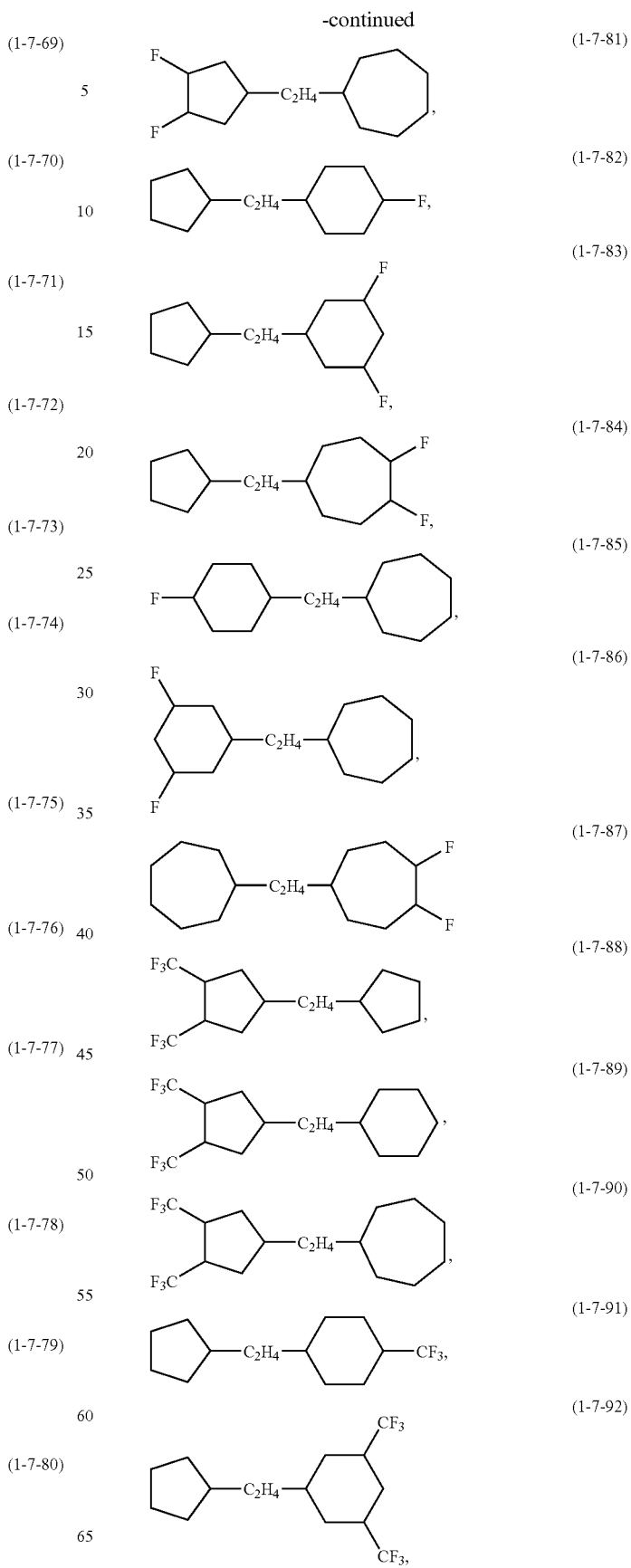

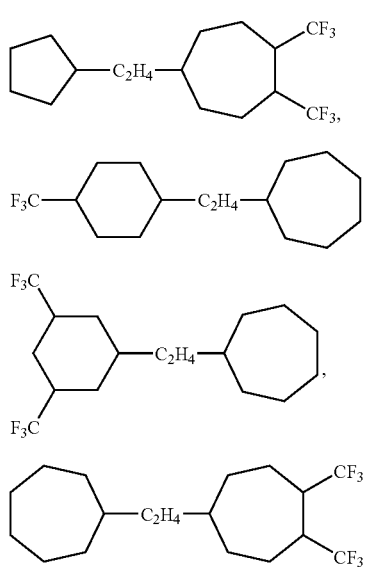

As examples of the preferred compound of the formula (1-7), dicyclohexyl and dicyclopentyl can be given.

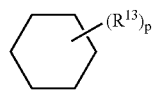 (1-8)

In the formula (1-8), $R^{13}$ represents an alkyl group having two or more carbon atoms, an alicyclic hydrocarbon group having three or more carbon atoms, a cyano group, a hydroxyl group, a fluorine atom, a fluorine-substituted hydrocarbon group having 2 to 10 carbon atoms, a group $-Si(R^9)_3$, or a group $-SO_3R^{10}$, p represents an integer from 1 to 6, provided that, when two or more $R^{13}$s exist, the $R^{13}$s may be the same or different, and two or more $R^{13}$s may be bonded to form a ring structure, and $R^9$ and $R^{10}$ represent alkyl groups having 1 to 10 carbon atoms.

$R^{13}$ is preferably an alkyl group having 2 to 10 carbon atoms or an alicyclic hydrocarbon group having 3 to 14 carbon atoms. p is preferably 1 or 2, and particularly preferably 1.

As the alkyl group having two or more carbon atoms, an alkyl group having 2 to 10 carbon atoms is preferable. As examples of the alkyl group having 2 to 10 carbon atom, a methyl group, ethyl group, n-propyl group, and the like can be given. As the alicyclic hydrocarbon group having three or more carbon atoms, an alicyclic hydrocarbon group having 3 to 14 carbon atoms is preferable. As examples of the alicyclic hydrocarbon group having 3 to 14 carbon atoms, a cyclohexyl group, norbornyl group, and the like can be given. The fluorine-substituted hydrocarbon group having 2 to 10 carbon atoms, group $-Si(R^9)_3$, and group $-SO_3R^{10}$ are the same as the fluorine-substituted hydrocarbon group, group $-Si(R^9)_3$, and group $-SO_3R^{10}$ in the formula (1-1). As examples of the ring structure formed when two or more $R^{13}$s are bonded, a cyclopentyl group, cyclohexyl group, and the like can be given.

Specific examples of preferred compounds of the formula (1-8) are given below.

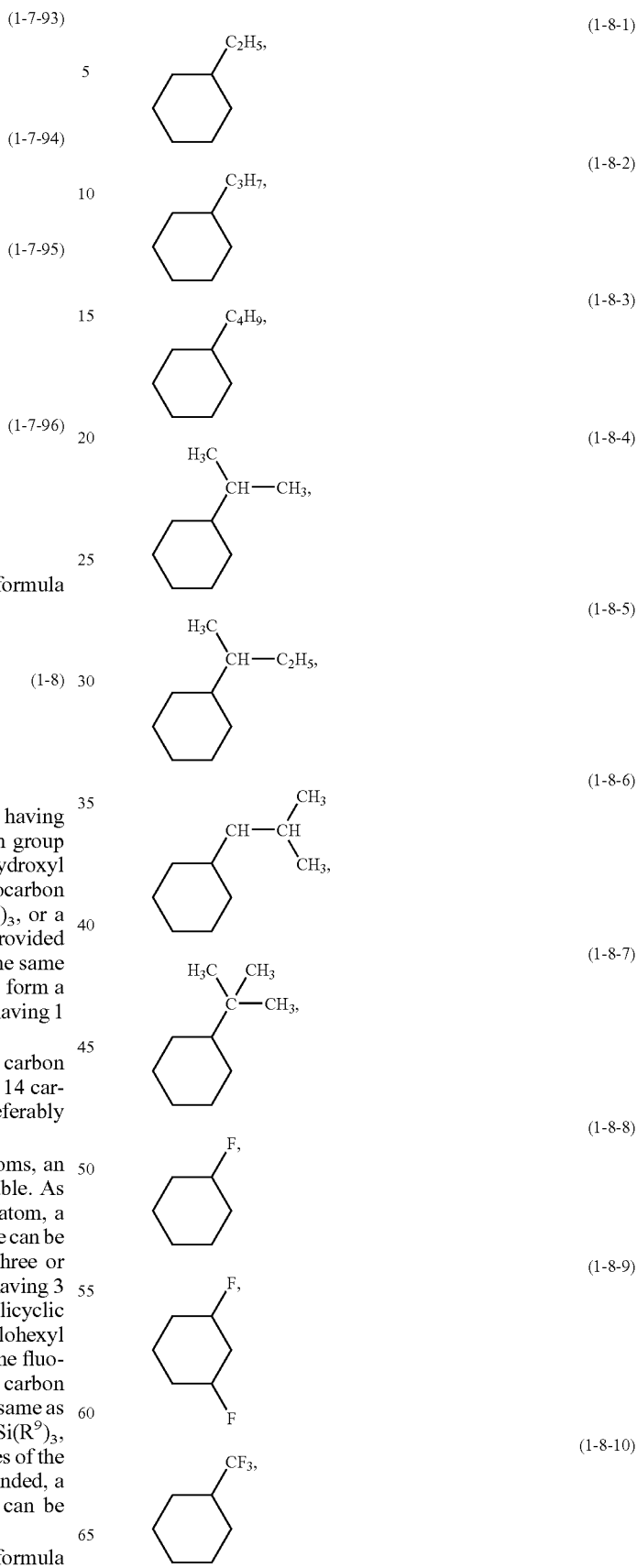

-continued

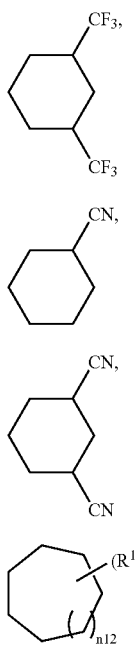

(1-8-11)

(1-8-12)

(1-8-13)

(1-9)

In the formula (1-9), $R^{14}$ represents an aliphatic hydrocarbon group having 1 to 10 carbon atoms, an alicyclic hydrocarbon group having 3 to 14 carbon atoms, a cyano group, a hydroxyl group, a fluorine atom, a fluorine-substituted hydrocarbon group having 1 to 10 carbon atoms, a group —Si($R^9$)$_3$, or a group —SO$_3$R$^{10}$, n12 represents an integer from 1 to 3, q represents an integer from 0 to 9, provided that, when two or more $R^{14}$s exist, the $R^{14}$s may be the same or different, and $R^9$ and $R^{10}$ represent alkyl groups having 1 to 10 carbon atoms.

$R^{14}$ is the same as $R^1$ in the formula (1-1). A group preferred for $R^{14}$ is the same as that for $R^1$. An integer preferred for q is the same as that for a.

Specific examples of preferred compounds of the formula (1-9) are given below.

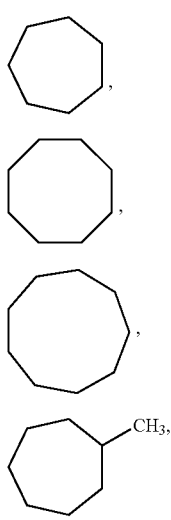

-continued

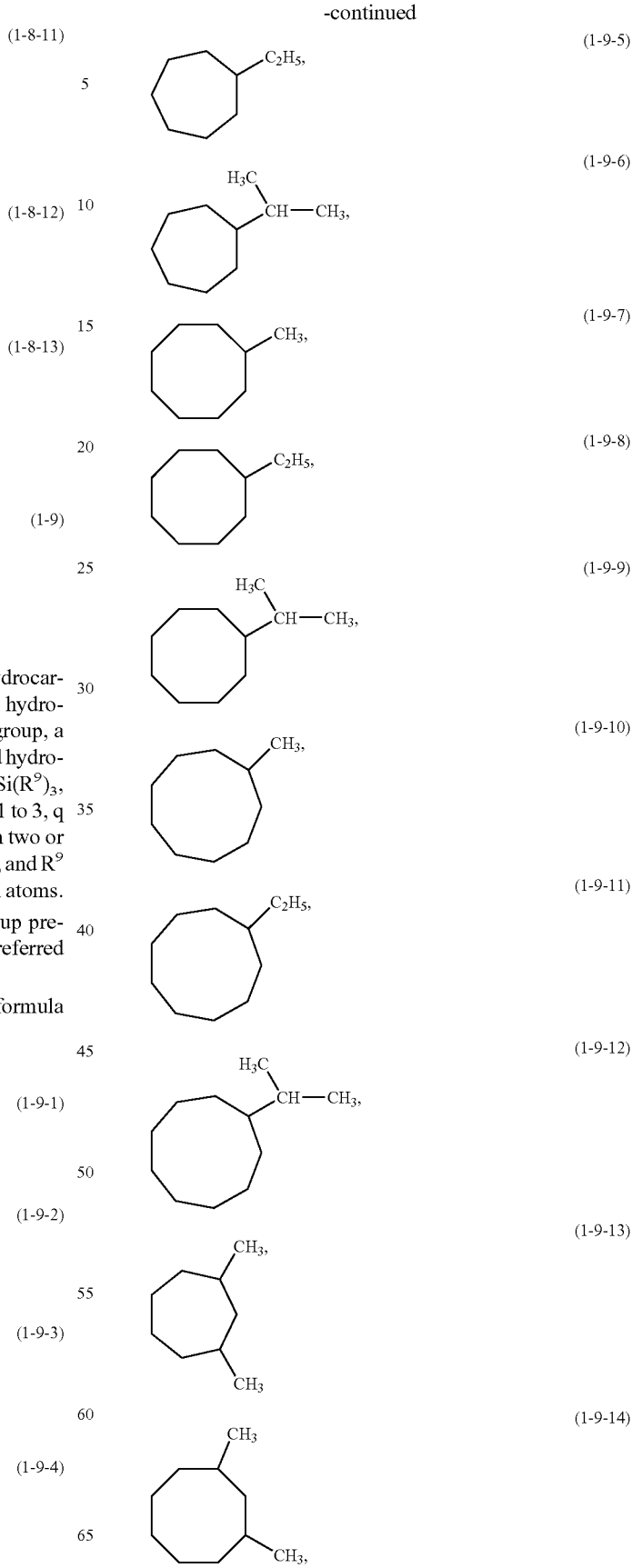

-continued

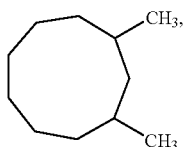
(1-9-15)

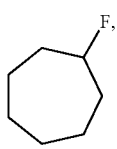
(1-9-16)

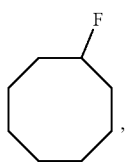
(1-9-17)

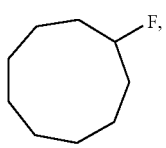
(1-9-18)

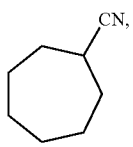
(1-9-19)

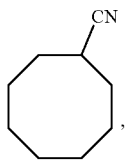
(1-9-20)

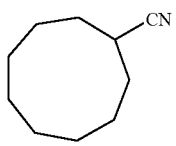
(1-9-21)

Particularly preferred compounds among the compounds of the formulas (1-1) to (1-9) are compounds which include the chemical structure of the formula (1-1) or (1-4) and are unsubstituted or replaced with the aliphatic saturated hydrocarbon group having 1 to 10 carbon atoms or the alicyclic saturated hydrocarbon group having 3 to 14 carbon atoms (preferably unsubstituted).

It is preferable that the above compounds be liquid at the operating temperature of the immersion exposure device and have a refractive index higher than that of pure water for the reasons described with reference to the expressions (iii) and (iv).

In more detail, it is preferable that the above compounds have a refractive index between the refractive index of water and the refractive index of a resist film (or an immersion upper layer film) before exposure and higher than the refractive index of water. It is preferable that the above compounds have a refractive index for light with a wavelength of 193 nm of 1.45 to 1.8, and preferably 1.6 to 1.8 at 25° C., and have a refractive index for light with a wavelength of 248 nm of 1.42 to 1.65, and preferably 1.5 to 1.65 at 25° C. It is preferable that the above compounds have a refractive index for D lines (wavelength: 589 nm) of 1.4 or more, preferably 1.4 to 2.0, and still more preferably 1.40 to 1.65 at 25° C.

It is preferable that the above compounds be compounds of which the refractive index is affected by the temperature, pressure, and the like to only a small extent, since a change in the refractive index due to a change in the use environment results in defocusing. In particular, since the temperature may change during use due to generation of heat accompanying absorption of light by the lens and resist materials, it is preferable that the temperature dependence of the refractive index be low. In more detail, the absolute value of the change rate dn/dT of the refractive index (n) due to temperature (T) is preferably $5.0 \times 10^{-3}$ (° C.$^{-1}$) or less, and still more preferably $7.0 \times 10^{-4}$ (° C.$^{-1}$) or less.

It is preferable that the above compounds have a high specific heat value from this point of view. In more detail, the specific heat value is preferably 0.1 cal/g·° C. or more, and still more preferably 0.30 cal/g·° C. or more.

It is preferable that the above compounds be compounds of which the refractive index is affected by chromatic aberration to only a small extent and which exhibit a small wavelength dependence of the refractive index near the exposure wavelength.

As other characteristics, it is preferable that the above compounds exhibit a high transmittance in the far ultraviolet region, have a viscosity, solubility of gas such as oxygen and nitrogen, contact angle with the lens and the resist (or a resist upper layer film), surface tension, flash point, and the like in the ranges given below, and exhibit a small chemical interaction with the lens and resist materials. These characteristics are described below in detail.

The transmittance of radiation with a wavelength of 193 nm at 25° C. is preferably 70% or more, particularly preferably 90% or more, and even more preferably 95% or more at an optical path length of 1 mm. If the transmittance is less than 70%, heat tends to be generated due to light absorption of the liquid, whereby an optical image may be defocused due to a change in refractive index caused by an increase in temperature, or distortion may occur. Moreover, the amount of light which reaches the resist film is decreased due to absorption by the liquid, whereby the throughput may be significantly decreased.

The viscosity of the liquid at 20° C. is 0.5 Pa·s or less. In particular, when the liquid is used in a state in which the gap between the wafer and the lens material is 1 mm or less, the viscosity is preferably 0.01 Pa·s or less, and particularly preferably 0.005 Pa·s or less. If the viscosity exceeds 0.5 Pa·s, the liquid may not enter the gap between the resist film (or an immersion upper layer film) and the lens material. Or, when a local immersion method is used as the immersion liquid supply method, and a step-and-scan method, in which the entire surface of the wafer is exposed by moving the stage on which the wafer is placed, is used as the exposure method, a sufficient scan speed may not be obtained, whereby the throughput may be significantly decreased. Moreover, since the temperature tends to be increased due to friction, the optical properties may change due to a change in temperature. In particular, when the gap between the wafer and the lens material is 1 mm or less, the viscosity is preferably 0.01 Pa·s or less for the reason described first. In this case, the transmittance of the liquid can be increased by reducing the distance between the resist film and the lens material (i.e. thickness of the liquid film), whereby the effects of absorption by the liquid can be reduced.

Moreover, bubbles (nanobubbles and microbubbles) tend to be produced in the liquid when the viscosity is increased, and the bubbles do not disappear for a long time.

The solubility of gas in the liquid according to the present invention is preferably $0.5 \times 10^{-4}$ to $70 \times 10^{-4}$, and preferably $2.5 \times 10^{-4}$ to $50 \times 10^{-4}$, as the solubility indicated by the molar fraction of oxygen and nitrogen in the liquid at a temperature of 25° C. and a partial pressure of 1 atmosphere (atm). If the solubility of the gas is $0.5 \times 10^{-4}$ or less, since nanobubbles produced from the resist or the like do not easily disappear, defects of the resist tend to occur during patterning due to light scattered by the bubbles. If the solubility of the gas is $70 \times 10^{-4}$ or more, since the liquid absorbs gas in the environment during exposure, the liquid tends to be affected by a change in optical properties due to absorption of the gas.

The contact angle between the liquid according to the present invention and the resist (or an immersion upper layer film) is preferably 20° to 90°, and still more preferably 50° to 80°. The contact angle between the liquid according to the present invention and the lens material such as quartz glass or $CaF_2$ is preferably 90° or less, and still more preferably 80° or less. If the contact angle between the liquid according to the present invention and the resist (or an immersion upper layer film) before exposure is 20° or less, the liquid may not enter the gap. Moreover, when using the combination of the local immersion method and the step-and-scan method as the exposure method, the liquid tends to be scattered in the film. If the contact angle between the liquid according to the present invention and the resist (or an immersion upper layer film) before exposure is 90° or more, the liquid tends to absorb gas at the interface with the resist (or an upper layer film) with an uneven surface, whereby bubbles easily occur. The above phenomenon is described in Immersion Lithography Modeling 2003 Year-End Report (International SEMATECH).

If the contact angle between the liquid according to the present invention and the lens material is more than 90°, bubbles tend to occur between the lens surface and the liquid.

When using the liquid according to the present invention for a step-and-scan exposure device currently used for immersion exposure of water by immersion using the similar local immersion method, scattering of the liquid during scan may cause a problem. Therefore, it is preferable that the liquid according to the present invention have a high surface tension. In more detail, the surface tension at 20° C. is preferably 5 to 90 dyn/cm, and still more preferably 20 to 80 dyn/cm.

When the contact angle between the liquid according to the present invention and the surface of the resist is not within the suitable range, the contact angle may be improved by using an appropriate immersion upper layer film. In particular, since the liquid according to the present invention exhibits low polarity, the contact angle can be increased by using a highly polar upper layer film.

If the resist components such as a photoacid generator and a basic component are extracted with the liquid according to the present invention, the patterning performance of the resist is adversely affected due to defects, deterioration of the profile, and the like. Moreover, since the liquid is contaminated, the optical properties of the liquid may change, or the lens may be eroded. This may make it difficult to recycle the liquid or may require frequent purification of the liquid. Therefore, it is preferable that the liquid be contaminated due to extraction to only a small extent. The amount of elution may be evaluated using an HPLC method or the like. Since the absorbance of light with a wavelength of 193 nm is extremely sensitive to the mixed resist component, the amount of elution may be evaluated by tracking a change in the absorbance. As a specific requirement for the liquid, it is preferable that a change in absorbance (absorbance after immersion—absorbance before immersion) per centimeter after immersion for 180 seconds in an immersion experiment described later in "Change in absorbance due to contact with resist" as the evaluation method be 0.05 or less, preferably 0.02 or less, and still more preferably 0.005 or less.

It is preferable that the liquid according to the present invention be a compound which rarely undergoes explosion, ignition, or the like in the use environment. In more detail, the flash point is preferably 25° C. or more, and still more preferably 50° C. or more, and the ignition point is preferably 180° C. or more, and still more preferably 230° C. or more. The vapor pressure at 25° C. is preferably 50 mmHg or less, and still more preferably 5 mmHg or less.

It is preferable that the liquid according to the present invention exhibit low toxicity to the human body and the environment. In regard to toxicity to the human body, the liquid according to the present invention is preferably a compound which exhibits low acute toxicity and does not exhibit carcinogenicity, mutagenicity, teratogenicity, reproductive toxicity, and the like. In more detail, a liquid of which the allowable level is preferably 30 ppm or more, and still more preferably 70 ppm or more, and the result of the Ames test is negative is preferable. In regard to toxicity to the environment, a compound which does not exhibit persistency and bioaccumulation properties is preferable.

It is preferable that the liquid according to the present invention have a purity measured by gas chromatography of 95.0 wt % or more, particularly preferably 99.0 wt % or more, and even more preferably 99.9 wt % or more.

In particular, it is preferable that the amount of compound containing an olefin exhibiting a high absorbance of light with an exposure wavelength (e.g. 193 nm), compound containing an aromatic ring, compound containing sulfur (sulfide, sulfoxide, or sulfone structure), halogen, carbonyl group, or ether group, and the like be less than 0.01 wt %, and particularly preferably less than 0.001 wt %.

Since the liquid including the compound is used for a semiconductor integrated circuit manufacturing step, it is preferable that the compound have a low metal or metal salt content. In more detail, the metal content is 100 ppb or less, preferably 10 ppb or less, and still more preferably 1.0 ppb or less. If the metal content exceeds 100 ppb, the resist film or the like may be adversely affected by the metal ion or the metal component, or the wafer may be contaminated.

As examples of the metal, at least one metal selected from Li, Na, K, Mg, Cu, Ca, Al, Fe, Zn, and Ni can be given. The metal content may be measured using an atomic absorption method.

The oxygen concentration in the liquid is 100 ppm (100 microgram/ml) or less, preferably 10 ppm or less, and still more preferably 2 ppm or less. The oxygen concentration during exposure is preferably 1 ppm or less, and still more preferably 10 ppm or less. If the oxygen concentration exceeds 100 ppm, the transmittance tends to be decreased due to oxidation caused by dissolved oxygen or the like. Even if oxidation does not occur, the absorbance of the liquid decreases depending on the dissolved oxygen concentration due to absorption of dissolved oxygen and ozone produced when applying radiation to oxygen, as described later in the examples. Moreover, when exposing the liquid in the presence of oxygen, ozone produced oxidizes the liquid, whereby deterioration of the liquid progresses.

When performing polarized light exposure, optical contrast decreases if the liquid exhibits optical activity. Therefore, it is preferable that the liquid not exhibit optical activity. In more detail, it is preferable that the compound forming the liquid not exhibit optical activity (optically inactive). When the compound forming the liquid exhibits optical activity (optically active), it is preferable that the liquid contain an optical isomer (existing as racemic modification) in an equal amount so that the liquid does not exhibit optical activity.

The compound according to the present invention may be obtained as a commercially available compound, or may be produced from raw materials obtained using a known synthesis method. The method of producing the compound according to the present invention is described below by way of examples.

For example, the compound of the formula (2-1) may be produced by nuclear hydrogenation of naphthalene or a naphthalene derivative contained in carbonized oil obtained from a coke oven, petroleum-based catalytic reformate and fluid catalytically cracked oil, naphtha cracked oil obtained as a by-product of ethylene production, or the like by catalytic hydrogenation using an appropriate catalyst.

The above catalytic reformate, fluid catalytically cracked oil, or naphtha cracked oil contains benzene, alkylbenzene, phenanthrene, anthracene, other polycyclic aromatics and derivatives thereof, sulfur-containing compounds such as benzothiophene and derivatives thereof, and nitrogen-containing compounds such as pyridine and derivatives thereof. Naphthalene and naphthalene derivatives used as the raw material may be obtained by separation and purification from the mixture.

Naphthalene and naphthalene derivatives used to produce the compound of the formula (2-1) preferably have a low content of the sulfur-containing compound. In this case, the content of the sulfur-containing compound is preferably 100 ppm or less, and still more preferably 50 ppm or less. If the content of the sulfur-containing compound exceeds 100 ppm, the sulfur-containing compound acts as a poison during catalytic hydrogenation to hinder the progress of the nuclear hydrogenation reaction. Moreover, when sulfur-containing impurities originating in the sulfur-containing compound are mixed into the compound of the formula (2-1) and cannot be removed by purification, the liquid according to the present invention exhibits a decreased transmittance of light with an exposure wavelength (e.g. 193 nm).

In particular, when producing cis-decalin or trans-decalin or a mixture thereof as the compound of the formula (2-1), it is preferable that the naphthalene used as the raw material have a high purity. The purity of naphthalene is preferably 99.0% or more, and particularly preferably 99.9% or more. In this case, when the content of sulfur compounds as impurities is high, the above-described problem occurs. When other naphthalene derivatives and aromatic compounds and derivatives thereof are contained as impurities, these impurities produce a hydrogenated hydrocarbon compound which is difficult to separate, whereby it becomes difficult to control the purity of decalin.

As the catalytic hydrogenation catalyst, a nickel-based catalyst, a noble metal-based catalyst such as platinum, rhodium, ruthenium, iridium, or palladium, or a sulfide of cobalt-molybdenum, nickel-molybdenum, nickel-tungsten, or the like may be used. Of these, the nickel-based catalyst is preferable from the viewpoint of catalytic activity and cost.

It is preferable to use the metal catalyst in a state in which the metal catalyst is supported on an appropriate carrier. In this case, the hydrogenation rate is increased by highly dispersing the catalyst on the carrier. In particular, deterioration of the active site at a high temperature and a high pressure is prevented, and resistance to poison is improved.

As the carrier, $SiO_2$, $\gamma$-$Al_2O_3$, $Cr_2O_3$, $TiO_2$, $ZrO_2$, MgO, $ThO_2$, diatomaceous earth, activated carbon, or the like may be suitably used.

As the catalytic hydrogenation method, a vapor phase method which does not use a solvent or a liquid phase method in which the raw material is dissolved and reacted in an appropriate solvent may be used. The vapor phase method is preferable due to low cost and high rate of reaction.

When using the vapor phase method, nickel, platinum, or the like is preferable as the catalyst. The rate of reaction increases as the amount of catalyst used increases. However, it is disadvantageous from the viewpoint of cost. Therefore, in order to increase the rate of reaction and complete the reaction, it is preferable to reduce the amount of catalyst and carry out the reaction at a high temperature and a high hydrogen pressure. In more detail, it is preferable to carry out the reaction using the catalyst in an amount of 0.01 to 10 parts by weight of the raw material naphthalene (naphthalene derivative) at a hydrogen pressure of 5 to 15 MPa and a reaction temperature of 100 to 400° C.

Or, the target substance may be obtained under mild conditions by removing naphthalene from tetralin (intermediate) using nickel or a platinum or palladium-based catalyst according to the method described in the patent document (JP-A-2003-160515), for example.

In the above reaction, the reaction conversion rate is preferably 90% or more, and still more preferably 99% or more.

It is preferable to remove an unreacted raw material and impurities such as the catalyst by appropriate purification after the above reaction.

As the purification method, precision distillation, washing with water, washing with concentrated sulfuric acid, filtration, crystallization, or a combination thereof may be used. Of these, precision distillation is preferably used, since precision distillation is effective for removing the nonvolatile metal contained in the catalyst and other metals and removing the component contained in the raw material. It is preferable to perform demetallization corresponding to the catalyst in order to remove the metal contained in the catalyst.

Among the above compounds, tetrahydrodicyclopentadiene may be obtained by hydrogenating dicyclopentadiene (exo/endo mixture) or endo-dicyclopentadiene, which is known to be useful as a raw material monomer for an optical lens/optical film resin, under appropriate conditions, and purifying the resulting tetrahydrodicyclopentadiene by distillation or the like. When selectively obtaining an exo-isomer from dicyclopentadiene, a dicyclopentadiene isomer mixture is isomerized using an appropriate catalyst to selectively obtain an exo-isomer and subjecting the exo-isomer to the above hydrogenation, or endo-(endo/exo mixture) tetrahydrodicyclopentadiene obtained by hydrogenating endo (endo/exo mixture) dicyclopentadiene is isomerized using an appropriate catalyst to selectively obtain exo-tetrahydrodicyclopentadiene.

Dicyclopentadiene is generally produced by dimerizing cyclopentadiene abundantly contained in a $C_5$ fraction obtained by thermally cracking naphtha. The resulting dicyclopentadiene contains a hydrocarbon component contained in the $C_5$ fraction such as 5-isopropenylnorbornene as impurities. In this case, a hydrocarbon product produced from these impurities remains after hydrogenation and isomerization, thereby making it difficult to purify tetrahydrodicyclopentadiene (end product). Therefore, it is preferable to use dicyclopentadiene of which the purity is increased in advance by purification or the like. In this case, the purity is preferably 95 wt % or more, and still more preferably 97 wt % or more.

It is preferable that dicyclopentadiene have a low content of the sulfur-containing component which acts as a poison during hydrogenation, for example. In more detail, the content of the sulfur-containing component in dicyclopentadiene is preferably 500 ppb or less, and still more preferably 50 ppb or less. If the content of the sulfur-containing component is 500 ppb, hydrogenation in the subsequent step tends to be hindered.

The term "sulfur-containing component" used herein refers to the total amount of sulfur elements which exist in the form of free sulfur, elemental sulfur, and inorganic and organic compounds such as hydrogen sulfide, mercaptan, disulfide, and thiophene, and may be analyzed using a gas chromatograph equipped with a sulfur chemiluminescence detector (SCD) or the like. The sulfur fraction may be removed using a method disclosed in JP-A-2001-181217, for example. Dicyclopentadiene may be hydrogenated using a known carbon-carbon double bond hydrogenation catalyst. The hydrogenation may be carried out using a method disclosed in JP-A-60-209536 or JP-A-2004-123762, for example. Tetrahydrodicyclopentadiene may be obtained by performing distillation after the hydrogenation. For example, in order to selectively obtain exo-tetrahydrodicyclopentadiene, a method has been known in which tetrahydrodicyclopentadiene is isomerized using various Lewis acids. The isomerization may be carried out using aluminum halide, sulfuric acid, or the like as the Lewis acid (JP-A-2002-255866), for example. In this reaction, adamantane is produced as a by-product. Since the transmittance of light with a wavelength of 193 nm decreases when a large amount of adamantane exists, the amount of adamantane which coexists in the final liquid must be 0.5 wt % or less, preferably 0.1 wt % or less, and still more preferably 0.05 wt % or less. Adamantane may be removed by appropriately setting the isomerization conditions or using a known purification method.

Table 1 shows specific examples of the structures and property values of preferred immersion exposure liquids.

TABLE 1

| Chemical formula or name | Boiling point (° C.) | Refractive index for D lines 20° C. | Viscosity (Pa.s) 20° C. |
|---|---|---|---|
| 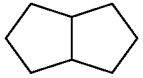 | 136 | 1.46 | 0.001859 |
| 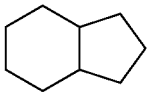 | 159 | 1.46 | 0.001618 |
| 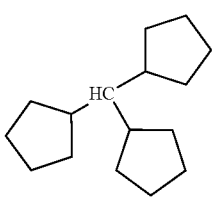 | 110.5/1Torr | 1.5 | 0.001011 |
| cis-Decalin | 195 | 1.48 | 0.003381 |
| trans-Decalin | 187 | 1.47 | 0.002128 |
| exo-Tetrahydrodicyclopentadiene | 185 | 1.49 | 0.001011 |
| Spiro[4.4]nonane | 154 | 1.46 | — |
| Tricyclopentylmethane | 110.5/1Torr | 1.50 | — |
| 2-Ethyladamantane | 219 | 1.50 | — |

Table 2 shows property data of trans-decalin and exo-tetrahydrodicyclopentadiene.

TABLE 2

| | | | Property value | |
|---|---|---|---|---|
| Item | Condition | Unit | trans-Decalin | exo-Tetrahydrodicyclopentadiene |
| Boiling point | 760 mHg | ° C. | 187.31 | 185 |
| Melting point | 760 mHg | ° C. | −30.382 | −79 |
| Specific gravity | 20° C.(/4° C.) | — | 0.86969 | 0.93 |
| Refractive index | 194.227 nm | — | 1.631 | 1.649 |
|  | 589 nm | — | 1.46932 | 1.49 |
| Temperature dependence of Refractive index (Dn/dT) | 194.227 nm | — | −0.00056 | −0.000056 |
| Pressure dependence of Refractive index (dn/dP) | — | — | $5 \times 10^{-10}$ | — |
| Dielectric constant | 20° C. | — | 2.172 | — |
| Dipole moment | — | D | 0 | — |
| Viscosity | 20° C. | cP | 2.128 | 2.86 |
| Surface tension | 20° C. | dyn/cm | 29.89 | — |
| Specific heat (constant pressure) | 20° C. | cal/deg. mol | 54.61 | 48.5 |
| Critical temperature | — | ° C. | 413.8 | — |
| Critical pressure | — | atm | 27 | — |
| Vapor pressure | 25° C. | mmHg | 0.78 | — |
| Thermal conductivity | 62.8° C. (D), 30° C. (W) | cal/cm. · s · deg | 0.000256 | — |
| Flash point | — | ° C. | 58 | 55 |
| Ignition point | — | ° C. | 262 | — |
| Oxygen solubility | 1 atm | ppm | 274 | 220 |
| Nitrogen solubility | 1 atm | ppm | 113 | 96 |

In Table 2, the oxygen solubility and the nitrogen solubility are values (ppm) when the partial pressure is 1 atm.

Since the immersion exposure liquid according to the present invention has a structure selected from the above formulas (1-1) to (1-9), the immersion exposure liquid has a small absorbance of light with a wavelength of 193 nm, for example. On the other hand, the absorbance in this wavelength region is easily affected by trace impurities. When a base component exists in the liquid, the resist profile is affected to a large extent even if the amount of base component is very small. The impurities may be removed by purifying the liquid using an appropriate method. For example, the saturated hydrocarbon compounds having the structure of the formulas (1-1) to (1-5) and (1-7) to (1-9) may be purified by washing with concentrated sulfuric acid, washing with water, alkali cleaning, silica gel column purification, precision distillation, permanganate treatment under alkaline conditions, or a combination of these.

In more detail, the compound may be purified by repeatedly washing the compound with concentrated sulfuric acid until the coloring due to the concentrated sulfuric acid disappears, removing the concentrated sulfuric acid by washing with water and alkali cleaning, washing the compound with water, drying the compound, and performing precision distillation.

The impurities can be more efficiently removed depending on the compound by treating the compound with a permanganate under alkaline conditions before the above treatment.

Among the above purification operations, washing with concentrated sulfuric acid is preferable since it is effective for removing an aromatic compound having a large absorption at a wavelength of 193 nm, a compound having a carbon-carbon unsaturated bond, and a basic compound contained in only a small amount. The treatment is preferably performed while selecting an optimum stirring method, temperature range, treatment time, and number of times of treatment depending on the purification target compound.

As the treatment temperature becomes higher, the impurity removal efficiency increases. However, impurities exhibiting absorption tend to be produced due to side reaction. The treatment reaction is preferably −20 to 40° C., and particularly preferably −10 to 20° C.

As the treatment time becomes longer, reaction with the above aromatic compound and impurities containing a carbon-carbon unsaturated bond progresses to increase the impurity removal efficiency. However, the amount of impurities exhibiting absorption produced due to side reaction tends to be increased.

When purifying the compound using the above concentrated sulfuric acid treatment, it is preferable to perform alkali cleaning, washing with pure water, and drying after the concentrated sulfuric acid treatment in order to completely remove acidic impurities originating in concentrated sulfuric acid which remain in the liquid according to the present invention and sulfonic acid components produced by the concentrated sulfuric acid treatment.

Impurities exhibiting absorption can be more efficiently removed by performing precision distillation after washing with concentrated sulfuric acid.

It is preferable to perform precision distillation using a distillation column having a number of theoretical plates equal to or greater than the number of theoretical plates necessary for separation corresponding to the difference in boiling point between removal target impurities and the liquid according to the present invention. The number of theoretical plates is preferably 10 to 100 from the viewpoint of impurity removal. However, since the equipment and production cost is increased when increasing the number of theoretical plates, the compound may be purified using a smaller number of plates by combining precision distillation with another purification method. The number of theoretical plates is particularly preferably 30 to 100.

It is preferable to perform precision distillation at an appropriate temperature. As the distillation temperature is increased, the absorption reduction effect tends to be decreased due to oxidation reaction of the compound and the like. The distillation reaction is preferably 30 to 120° C., and particularly preferably 30 to 80° C.

It is preferable to perform precision distillation under reduced pressure, as required, in order to allow distillation in the above temperature range.

The above purification treatment is preferably performed in an inert gas atmosphere such as nitrogen or argon. In this case, it is preferable that the oxygen concentration and the organic component concentration in the inert gas be low. The oxygen concentration is preferably 1000 ppm or less, still more preferably 10 ppm or less, and particularly preferably 1 ppm or less.

The permanganate treatment is particularly effective for removing a nonaromatic carbon-carbon unsaturated bond-containing compound. When subjecting a compound containing a tertiary carbon atom to the permanganate treatment, oxidation of the tertiary carbon atom tends to occur. Therefore, the permanganate treatment is suitable for purifying a compound which does not contain a tertiary carbon atom.

It is preferable to perform the permanganate treatment at a temperature equal to or lower than room temperature in order to prevent side reactions.

Tables 3 and 4 show refractive index and transmittance measurement results of decalin (cis/trans mixture: manufactured by Aldrich), trans-decalin (manufactured by Tokyo Kasei Kogyo Co., Ltd.), purified trans-decalin (1), purified dicyclohexyl, purified isopropylcyclohexane, purified cyclooctane, and purified cycloheptane purified using a method of Example 1 described later, purified trans-decalin (2) purified using a method of Example 2, purified exo-tetrahydrodicyclopentadiene (1) purified using a method of Example 3, purified exo-tetrahydrodicyclopentadiene (2) purified using a method of Example 4, purified trans-decalin (3) purified using a method of Example 5, purified exo-tetrahydrodicyclopentadiene (3) purified using a method of Example 6, and purified dicyclohexyl, isopropyl cyclohexane, cyclooctane, and cycloheptane purified using a method of Example 7. Acetonitrile as a reference liquid, pure water used as an immersion exposure liquid, and methylene iodide were used as comparative examples.

The refractive index in the ultraviolet region was measured for the cis/trans-decalin, purified trans-decalin, dicyclohexyl, isopropylcyclohexane, cyclooctane, cycloheptane, and acetonitrile. A goniometer-spectrometer I UV-VIS-IR manufactured by MOLLER-WEDEL was used as the measurement instrument. The refractive index was measured using an angle of minimum deviation method at a temperature of 25° C.

The transmittance was measured using a measurement method A or a measurement method B. In the measurement method A, the liquid was sampled into a cell with a polytetrafluoroethylene lid (optical path length: 10 mm) in a glove box containing a nitrogen atmosphere of which the oxygen concentration was controlled at 0.5 ppm or less, and the transmittance was measured using the cell with air as a reference utilizing JASCO-V-550 manufactured by JASCO Corporation. The value shown in the table was obtained by correcting the reflection of the cell by calculation and converting the resulting value into the value at an optical path length of 1 mm.

In the measurement method B, the liquid was sampled into a quartz cell with a polytetrafluoroethylene lid (optical path length of measurement cell: 50 mm, optical path length of reference cell: 10 mm) in a glove box containing a nitrogen atmosphere of which the oxygen concentration was controlled at 0.5 ppm or less. The transmittance was measured using the cell with an optical path length of 50 mm as a sample and the cell with an optical path length of 10 mm as a reference utilizing JASCO-V-550 manufactured by JASCO Corporation. The measured value was taken as the absorbance at an optical path length of 40 mm. The value shown in the table was obtained by converting the resulting value into a value at an optical path length of 1 mm.

Therefore, it is preferable to subject the compound to a degassing treatment and store the resulting compound in an inert gas which exhibits only a small degree of absorption, such as nitrogen or argon. In more detail, it is preferable that the oxygen concentration in the liquid during storage be 100 ppm or less, and still more preferably 10 ppm or less. When oxygen cannot be removed before exposure, the oxygen concentration is preferably 1 ppm or less, and still more preferably 10 ppb or less.

TABLE 3

Refractive index

| Wavelength (nm) | Decalin (cis/trans-mixture) | Purified trans-decalin (1) | Purified exotetra-hydrodicyclopentadiene (1) | Purified dicyclohexyl | Purified isopropylcyclohexane | Purified cyclooctane | Purified cycloheptane | Acetonitrile | Pure water |
|---|---|---|---|---|---|---|---|---|---|
| 589 | 1.475 | 1.469 | 1.49 | 1.479 | 1.44 | 1.458 | 1.445 | 1.344 | 1.332 |
| 486.269 | 1.477 | 1.48 | 1.4926 | — | — | — | — | 1.345 | — |
| 388.975 | 1.4989 | — | — | — | — | — | — | 1.353 | — |
| 312.657 | 1.501 | — | 1.5228 | — | — | 1.4893 | 1.475 | 1.366 | — |
| 289.444 | 1.517 | — | — | — | — | 1.518 | 1.5035 | 1.386 | — |
| 253.728 | 1.539 | — | 1.5547 | — | — | — | — | 1.403 | — |
| 226.572 | 1.568 | — | — | — | — | — | — | 1.414 | — |
| 214.506 | 1.586 | — | 1.6014 | — | — | 1.561 | 1.545 | 1.428 | — |
| 194.227 | 1.637 | 1.6315 | 1.6492 | 1.6384 | 1.5826 | — | — | 1.441 | 1.433 |

TABLE 4

| | Transmittance (193 nm; mm$^{-1}$) (%) | | Refractive index (193 nm) | Refractive index (589 nm) |
|---|---|---|---|---|
| | Measurement method A | Measurement method B | | |
| Decalin (cis/trans-mixture) | 73.5 | — | 1.64 | 1.48 |
| trans-Decalin (Tokyo Kasei) | 10 or less | — | — | 1.48 |
| Purified trans-decalin (1) | 93.4 | — | 1.63 | 1.48 |
| Purified trans-decalin (2) | 96.8 | — | 1.63 | 1.48 |
| Purified trans-decalin (3) | — | 99.5 | 1.63 | 1.48 |
| exo-Tetrahydrodicyclopentadiene | 10 or less | — | — | 1.49 |
| Purified exo-tetrahydrodicyclopentadiene (1) | 87.7 | — | 1.65 | 1.49 |
| Purified exo-tetrahydrodicyclopentadiene (2) | 97.5 | — | 1.65 | 1.49 |
| Purified exo-tetrahydrodicyclopentadiene (3) | — | 99.6 | 1.65 | 1.49 |
| Purified dicyclohexyl | 97.3 | — | 1.64 | 1.48 |
| Purified isopropylcyclohexane | 76.3 | — | 1.59 | 1.44 |
| Purified cyclooctane | 70.2 | — | — | 1.46 |
| Purified cycloheptane | 71 | — | — | 1.44 |
| Acetonitrile | 91.8 | — | 1.44 | 1.34 |
| Pure water | 94 | — | 1.44 | 1.34 |
| Methylene iodide | 10 or less | — | — | 1.7 |

As shown in Tables 3 and 4, the refractive index increases as the wavelength decreases. The liquid according to the present invention in Tables 3 and 4 has a high refractive index of 1.58 or more at a wavelength of 193 nm, for example.

Since the compound according to the present invention is a low-polarity compound, the compound exhibits high solubility of gas such as oxygen or nitrogen. Therefore, the compound according to the present invention tends to be affected by dissolution of such a gas. For example, when the compound is allowed to stand in air, the transmittance of light with a wavelength of 193 nm tends to be decreased due to absorption by dissolved oxygen, absorption by ozone produced when dissolved oxygen is excited due to light, or an oxidation reaction in which dissolved oxygen takes part, for example.

The immersion exposure method using the immersion exposure liquid according to the present invention is described below.

The immersion exposure liquid according to the present invention is preferably stored in an inert gas, as described above. It is preferable to store the immersion exposure liquid in a container of which the component of the container or the component of the lid (e.g. plasticizer added to plastic) is not eluted. As examples of a preferred container, containers made of glass, metal (e.g. SS), ceramics, and fluoroesins such as polytetrafluoroethylene (PTFE), perfluoroethylenepropene copolymer (PFEP), ethylene-chlorotrifluoroethylene copolymer (ECTFE), polytetrafluoroethylene-perfluorodioxole copolymer (PTFE/PDD), perfluoroalkoxyalkane (PFA), ethylene-tetrafluoroethylene copolymer (ETFE), polyvinylidene fluoride (PVDF), polyvinyl fluoride (PVF), and polychlorotrifluoroethylene (PCTFE) can be given. Of these, a container made of glass or a fluororesin is particularly preferable.

As examples of a preferred lid of the container, a polyethylene lid which does not contain a plasticizer, lids made of glass, metal (e.g. SS), ceramics, and fluororesins such as polytetrafluoroethylene (PTFE), perfluoroethylenepropene copolymer (PFEP), ethylene-chlorotrifluoroethylene copolymer (ECTFE), polytetrafluoroethylene-perfluorodioxole copolymer (PTFE/PDD), perfluoroalkoxyalkane (PFA), ethylene-tetrafluoroethylene copolymer (ETFE), polyvinylidene fluoride (PVDF), polyvinyl fluoride (PVF), and polychlorotrifluoroethylene (PCTFE) can be given.

As the pipe used to supply the liquid from the container to an exposure system, a tube of which the component is not eluted is preferable. As preferred materials for the pipe, glass, metal, ceramics, and the like are can be given.

When using the immersion exposure liquid according to the present invention for immersion exposure, since microparticles or bubbles (microbubbles) may cause pattern defects and the like, a dissolved gas which causes microparticles or bubbles is preferably removed before exposure.

As the microparticle removal method, a filtration method using an appropriate filter can be given. As the filter, it is preferable to use a filter formed of a material which exhibits excellent microparticle removal efficiency and does not show a change in absorption at an exposure wavelength due to elution during filtration. As examples of a preferred material for the filter, glass, metal (e.g. SS and silver), metal oxide, and fluororesins such as polytetrafluoroethylene (PTFE), perfluoroethylenepropene copolymer (PFEP), ethylene-chlorotrifluoroethylene copolymer (ECTFE), polytetrafluoroethylene-perfluorodioxole copolymer (PTFE/PDD), perfluoroalkoxyalkane (PFA), ethylene-tetrafluoroethylene copolymer (ETFE), polyvinylidene fluoride (PVDF), polyvinyl fluoride (PVF), and polychlorotrifluoroethylene (PCTFE) can be given. It is preferable that the materials for peripheral parts of the filter such as the housing, core, support, and plug be selected from the above preferred materials for the filter.

As examples of the dissolved gas removal method, a reduced pressure degassing method, an ultrasonic degassing method, a degassing method using a gas permeable membrane, a degassing method using various degassers, and the like can be given.

Since the immersion exposure liquid according to the present invention forms part of the optical system during exposure, it is preferable to use the immersion exposure liquid in an environment in which the optical properties of the liquid such as the refractive index do not change. For example, it is preferable to use the immersion exposure liquid in an environment in which the temperature, pressure, and the like which affect the optical properties of the liquid are maintained constant. For example, it is preferable to control the temperature in the range of ±0.1° C., and still more preferably ±0.01° C.

Immersion exposure using the liquid according to the present invention may be carried out in air. However, since the liquid according to the present invention exhibits high oxygen solubility as described above, the absorption properties at an exposure wavelength may be affected. Therefore, it is preferable to carry out exposure in an inert gas which exhibits only a small degree of absorption at an exposure wavelength and does not undergo chemical reaction with the liquid. As examples of a preferred inert gas, nitrogen, argon, and the like can be given.

In order to prevent a change in the absorption properties of the liquid at an exposure wavelength due to contamination caused by an organic component in air, it is preferable to control the organic component concentration in the atmosphere used at a level equal to or lower than a specific level. As the organic component concentration control method, a method of using a high-purity inert gas atmosphere, a method of using a filter which absorbs the organic component and various gas purification tubes (devices), and the like can be given. It is preferable to periodically analyze the atmosphere in order to control the concentration. For example, various analysis methods using gas chromatography may be used.

As the method of supplying the immersion liquid to the exposure region, a moving pool method, a swimming stage method, and a local fill method (local immersion method) have been known (see the seminar text of special seminar on immersion exposure technology (May 27, 2004)). Of these, the local immersion method is preferable, since the amount of immersion exposure liquid used is small.

As the final (objective) lens material for immersion exposure using the liquid according to the present invention, $CaF_2$ or fused silica is preferable from the viewpoint of optical properties. As other lens materials, a fluorine salt and a salt of the general formula $Ca_xM_{1-x}F_2$ of a heavier alkaline earth metal M, alkaline earth metal oxides such as CaO, SrO, and BaO, and the like are preferable. Since the refractive index of the lens increases when using such a material in comparison with $CaF_2$ (n@193 nm=1.50) or fused silica (n@193 nm=1.56), such a material is preferably used when designing and processing a high NA lens with a numerical aperture of more than 1.5.

Since the resist component is extracted with the liquid according to the present invention to only a small extent, the liquid according to the present invention can be recycled after use. When using a resist (or a resist upper layer film) which is not eluted during exposure, the liquid according to the present invention may be recycled without purification. In this case, it is preferable to recycle the liquid after subjecting the liquid to degassing, filtration, and the like. The above treatment is preferably performed in-line in order to simplify the treatment step.

Even if the resist film is not eluted to a large extent after using the liquid once, the properties of the liquid may change due to effects of impurities when the resist film is used a number of times exceeding a specific number. Therefore, it is preferable to recover and purify the liquid after using the liquid a specific number of times.

As the purification method, washing with water, acid cleaning, alkali cleaning, precision distillation, purification using an appropriate filter (packed column), filtration, the above-described purification method for the liquid according to the present invention, and a combination of these purification methods can be given. In particular, it is preferable to purify the liquid using washing with water, alkali cleaning, acid cleaning, precision distillation, or a combination of these purification methods.

Alkali cleaning is effective for removing an acid generated in the liquid according to the present invention upon exposure, acid cleaning is effective for removing a basic component in the resist eluted into the liquid according to the present invention, and washing with water is effective for removing a photoacid generator and a basic additive in the resist film dissolved in the liquid according to the present invention and an acid generated upon exposure.

Precision distillation is effective for removing a low-volatile compound contained in the above additive, and is also effective for removing a hydrophobic component produced by decomposition of a protecting group in the resist upon exposure.

The immersion exposure liquids of the formulas (1-1) to (1-9) may be used either individually or in combination. It is preferable to individually use the immersion exposure liquid. The immersion exposure conditions can be easily set by individually using the immersion exposure liquid.

The liquid according to the present invention may be used as a mixture with a liquid other than the liquid according to the present invention, as required. This allows the optical property values such as the refractive index and the transmittance and the property values such as the contact angle, specific heat, viscosity, and expansion coefficient to be adjusted to desired values.

As the liquid other than the liquid according to the present invention used for this purpose, a solvent which can be used for immersion exposure, an anti-foaming agent, a surfactant, and the like may be used. Use of such a liquid is effective for reducing bubbles or controlling surface tension.

Immersion exposure is carried out using the above immersion exposure liquid.

A photoresist is applied to a substrate to form a photoresist film. As the substrate, a silicon wafer, an aluminum-coated wafer, or the like may be used. In order to bring out the potential of the resist film, an organic or inorganic antireflection film may be formed on the substrate as disclosed in JP-B-6-12452, for example.

The photoresist used is not particularly limited, and may be appropriately selected depending on the purpose of the resist. As the resin component of the photoresist, an acid-labile group-containing polymer can be given. It is preferable that the acid-labile group not be decomposed upon exposure. It is particularly preferable that the decomposed product volatilize under the exposure conditions and not be eluted into the liquid according to the present invention. As examples of such a polymer, a resin containing an alicyclic group, lactone group, derivative thereof, and the like in the polymer side chain, a resin containing a hydroxystyrene derivative, and the like can be given.

In particular, a photoresist using a resin containing an alicyclic group, lactone group, and derivative thereof in the polymer side chain is preferable. Since such a photoresist includes a chemical structure similar to that of the alicyclic hydrocarbon compound or the cyclic hydrocarbon compound containing a silicon atom in its ring structure, such a photoresist exhibits excellent affinity with the immersion exposure liquid according to the present invention. Moreover, the photoresist film is not eluted or dissolved.

As examples of the photoresist, a positive-tone or negative-tone chemically-amplified resist containing an acid-labile group-containing polymer (resin component), an acid generator, and additives such as an acid diffusion controller and the like can be given.

When using the immersion exposure liquid according to the present invention, the positive-tone resist is preferable. In the chemically-amplified positive-tone resist, an acid-labile group in the polymer dissociates by the action of an acid generated from the acid generator upon exposure to produce a carboxyl group, for example. As a result, the exposed portion of the resist exhibits increased solubility in an alkaline developer and is dissolved in and removed by an alkaline developer, whereby a positive-tone resist pattern is obtained.

The photoresist film is formed by dissolving a resin composition for forming the photoresist film in an appropriate solvent to a solid content of 0.1 to 20 wt %, filtering the solution through a filter with a pore size of about 30 nm to obtain a resist solution, applying the resist solution to a substrate using an appropriate coating method such as rotational coating, cast coating, or roll coating, and prebaking (hereinafter abbreviated as "PB") the applied resist solution to volatilize the solvent. In this case, a commercially available resist solution may be directly used. It is preferable that the photoresist film have a high refractive index higher than that of the immersion upper layer film and the immersion exposure liquid. In more detail, it is preferable that the photoresist film have a refractive index $n_{RES}$ of 1.65 or more. In particular, it is preferable that the refractive index $n_{RES}$ be 1.75 or more when the numerical aperture NA is 1.3 or more. In this case, a decrease in the contrast of exposure light due to an increase in the numerical aperture NA can be prevented.

In the immersion exposure method, the immersion upper layer film may be formed on the photoresist film.

As the immersion upper layer film, a film may be used which exhibits sufficient transparency for the wavelength of exposure light, can form a protective film on the photoresist film without being intermixed with the photoresist film, is not eluted into the liquid used during immersion exposure to maintain a stable film, and can be removed before development. In this case, it is preferable that the upper layer film be easily dissolved in a developer, since the upper layer film is removed during development.

As the substituent for providing alkali solubility, a resin containing at least one of a hexafluorocarbinol group and a carboxyl group in the side chain is preferable.

The immersion upper layer film preferably has a multiple interference prevention function. In this case, the immersion upper layer film preferably has a refractive index $n_{OC}$ shown by the following expression.

$$n_{OC} = (n_{Iq} \times n_{RES})^{0.5}$$

In the above expression, $n_{Iq}$ indicates the refractive index of the immersion exposure liquid, and $n_{RES}$ indicates the refractive index of the resist film.

It is preferable that the refractive index $n_{OC}$ be 1.6 to 1.9.

The immersion upper layer film may be formed by dissolving an immersion upper layer film resin composition in a solvent which is not intermixed with the resist film to a solid content of 0.01 to 10%, applying the solution in the same manner as in the formation of the photoresist film, and prebaking the applied solution.

A resist pattern is formed by applying radiation to the photoresist film or the photoresist film on which the immersion upper layer film is formed using the immersion exposure liquid according to the present invention as a medium through a mask having a specific pattern, and developing the photoresist film. In this step, the photoresist film is subjected to immersion exposure, baked at a specific temperature, and developed.

As the radiation used for immersion exposure, various types of radiation such as visible light; ultraviolet rays such as g-line and i-line; far ultraviolet rays such as an excimer laser light; X-rays such as synchrotron radiation; and charged particle rays such as electron beams may be selectively used depending on the photoresist film used and the combination of the photoresist film and the immersion upper layer film. In particular, it is preferable to use light from an ArF excimer laser (wavelength: 193 nm) or a KrF excimer laser (wavelength: 248 nm).

It is preferable to perform post exposure baking (hereinafter abbreviated as "PEB") in order to provide the resist film with improved resolution, pattern profile, developability, and the like. The baking temperature is usually about 30 to 200°

C., and preferably 50 to 150° C., although the baking temperature is appropriately adjusted depending on the resist used and the like.

The photoresist film is then developed using a developer and washed to form a desired resist pattern.

EXAMPLES

In order to evaluate the immersion exposure liquid according to the present invention, a resist film was formed using a radiation-sensitive resin composition given below. An immersion upper layer film given below was formed on part of the resist film. The characteristics (elution test, film solubility test, and patterning evaluation) of the immersion exposure liquid were measured using the resulting evaluation resist film.

Reference Example 1

A resin used for the radiation-sensitive resin composition was obtained using the following method.

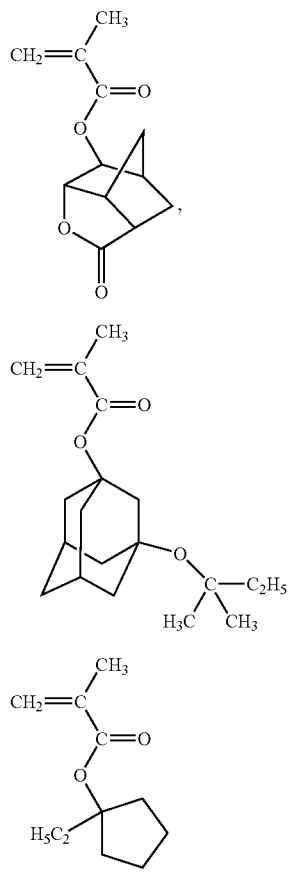

A monomer solution was prepared by dissolving 39.85 g (40 mol %) of the compound (S1-1), 27.47 g (20 mol %) of the compound (S1-2), and 32.68 g (40 mol %) of the compound (S1-3) in 200 g of 2-butanone and adding 4.13 g of methyl azobisisovalerate to the solution. A 1,000 ml three-neck flask charged with 100 g of 2-butanone was purged with nitrogen for 30 minutes. After purging with nitrogen, the contents of the flask were heated to 80° C. with stirring. The monomer solution prepared in advance was then added dropwise to the flask over three hours using a dripping funnel. The monomers were polymerized for five hours after initiation of the addition (i.e. polymerization start time). After completion of polymerization, the polymer solution was cooled with water to 30° C. or less and poured into 2,000 g of methanol, and the precipitated white powder was separated by filtration. The separated white powder was washed twice with 400 g of methanol, separated by filtration, and dried at 50° C. for 17 hours to obtain a white powdery polymer (75 g; yield: 75 wt %). The polymer had a molecular weight of 10,300. As a result of $^{13}$C-NMR analysis, it was found that the polymer was a copolymer containing recurring units of the compound (S1-1), the compound (S1-2), and the compound (S1-3) at a ratio of 42.3:20.3:37.4 (mol %). This polymer is called a resin (A-1).

Reference Example 2

A resin used for the radiation-sensitive resin composition was obtained using the following method.

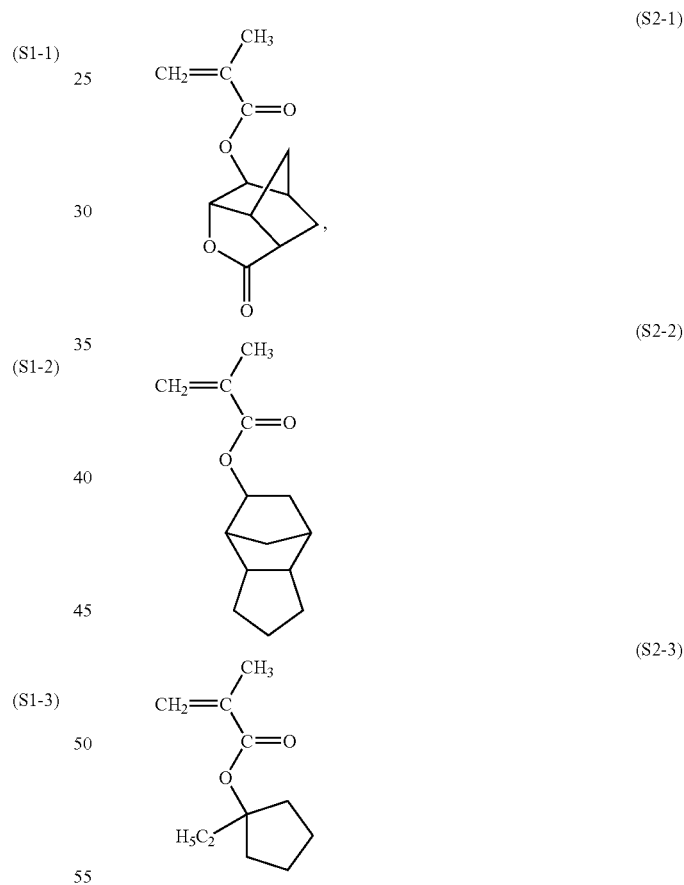

A monomer solution (1) was prepared by dissolving 53.92 g (50 mol %) of the compound (S2-1), 10.69 g (10 mol %) of the compound (S2-2), and 35.38 g (40 mol %) of the compound (S2-3) in 187 g of 2-butanone, and a solution (2) was prepared by dissolving 3.37 g of dimethyl 2,2'-azobis(2-methyl propionate) in 64 g of 2-butanone. A 1,000 ml three-neck flask containing 15 g of 2-butanone was charged with 28.77 g of the monomer solution (1) and 4.23 g of the solution (2), and purged with nitrogen using a reduced pressure replacement method. After purging with nitrogen, the contents of the flask were heated to 80° C. with stirring. After 15 minutes, 258.98 g of the monomer solution (1) and 24.64 g of the solution (2) were added dropwise to the flask over three hours using a pump. After the addition, the mixture was stirred for four hours. After completion of polymerization, the polymer solution was allowed to cool to 30° C. or less. The solution was then allowed to cool to 30° C. or less and poured into 4,000 g of isopropyl alcohol, and the precipitated white powder was separated by filtration. The separated white powder was washed twice with 2,000 g of isopropyl alcohol, separated by filtration, and dried at 60° C. for 17 hours to obtain a white powdery polymer (85 g; yield: 85 wt %). The polymer had a molecular weight (Mw) of 7,600. As a result of $^{13}$C-NMR analysis, it was found that the polymer was a copolymer containing recurring units of the compound (S2-1), the compound (S2-2), and the compound (S2-3) at a ratio of 53.1:8.5:38.4 (mol %). This polymer is called a resin (A-2).

Reference Example 3

A resin used to form the immersion upper layer film was obtained using the following method.

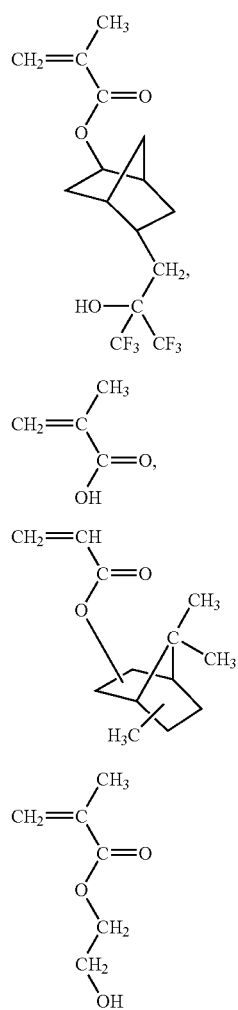

A homogenous monomer solution was prepared by dissolving 50 g of the compound (S3-1), 5 g of the compound (S3-2), 25 g of the compound (S3-3), 20 g of the compound (S3-4), and 6.00 g of methyl azobisisovalerate in 200 g of methyl ethyl ketone. A 1,000 ml three-neck flask charged with 100 g of methyl ethyl ketone was purged with nitrogen gas for 30 minutes. After purging with nitrogen, the contents of the flask were heated to 80° C. with stirring. The monomer solution prepared in advance was added dropwise to the flask using a dripping funnel at a rate of 10 ml per five minutes. The monomers were polymerized for five hours after initiation of the addition (i.e. polymerization start time). After completion of polymerization, the reaction solution was cooled to 30° C. or less and poured into 2,000 g of heptane, and the precipitated white powder was separated by filtration. The separated white powder was mixed with 400 g of heptane to prepare a slurry, and the slurry was stirred. After performing this operation twice, the slurry was washed, separated by filtration, and dried at 50° C. for 17 hours to obtain a white powdery resin (E-1) (89 g; yield: 89 wt %). The resin (E-1) had a molecular weight (Mw) of 7,300.

Reference Example 4

A resin used to form the immersion upper layer film was obtained using the following method.

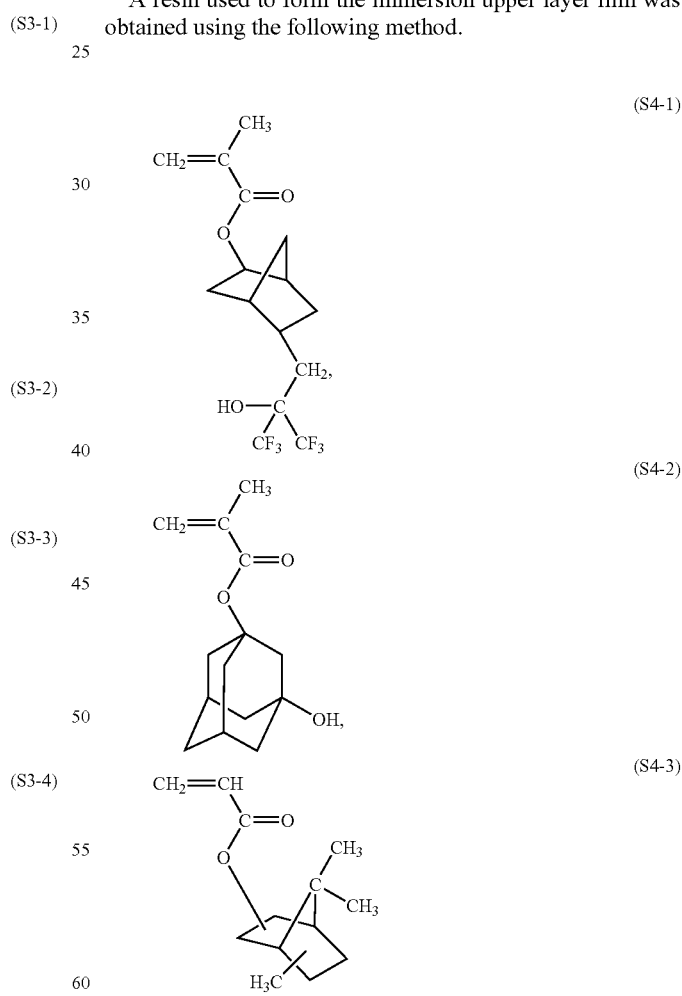

A white powdery resin (E-2) was obtained in the same manner as in Reference Example 3 except for using 70 g of the compound (S4-1), 20 g of the compound (S4-2), and 10 g of the compound (S4-3) as the monomers (88 g; yield: 88 wt %). The resin (E-2) had a molecular weight (Mw) of 6,800.

Reference Example 5

The radiation-sensitive resin composition was obtained using the following method.

A resin, acid generator, acid diffusion controller, and solvent shown in Table 5 were mixed to prepare a homogeneous solution. The solution was filtered through a membrane filter with a pore size of 200 nm to obtain a radiation-sensitive resin composition (F1 to F3). In Table 5, part refers to part by weight.

The acid generator (B), acid diffusion controller (C), and solvent (D) used are as follows.

Acid Generator (B)
B-1: 4-nonafluoro-n-butylsulfonyloxyphenyl.diphenylsulfonium nonafluoro-n-butanesulfonate
B-2: triphenylsulfonium.nonafluoro-n-butanesulfonate Acid Diffusion Controller (C)
C-1: 2-phenylbenzimidazole Solvent (D)
D-1: propylene glycol monoethyl ether acetate

TABLE 5

| Radiation-sensitive resin composition | Resin (A) (part) | Acid generator (B) (part) | Acid diffusion controller (C) (part) | Solvent (D) (part) |
|---|---|---|---|---|
| F-1 | A-1(100) | B-1(2.5) | C-1(0.2) | D-1(750) |
| F-2 | A-2(100) | B-1(2.5) | C-1(0.2) | D-1(750) |
| F-3 | A-2(100) | B-2(2.5) | C-1(0.2) | D-1(750) |

Reference Example 6

An immersion upper layer film composition was obtained using the following method.

A resin and a solvent shown in Table 6 were mixed to prepare a homogeneous solution. The solution was filtered through a membrane filter with a pore size of 200 nm to obtain an immersion upper layer film composition (G1 and G2). In Table 6, n-BuOH indicates n-butanol, and part refers to part by weight.

TABLE 6

| Upper layer film composition | Resin (E) (part) | Solvent (part) |
|---|---|---|
| G-1 | E-1(1) | n-BuOH (99) |
| G-2 | E-2(1) | n-BuOH (99) |

Reference Example 7

The evaluation resist film (H-1 to H-5) was obtained using the following method.

A lower-layer anti-reflective film ARC29 (manufactured by Brewer Science) was applied to an eight-inch silicon wafer by spin coating a PB (90° C., 60 sec) to form a coating with a thickness of 77 nm. Then, a resist film (thickness: 205 nm) was formed using the radiation-sensitive resin composition shown in Table 7 under the same conditions (H-1 to H-3).

After forming a resist film (thickness: 205 nm) using the radiation-sensitive resin composition in the same manner as described above, an upper layer film with a thickness of 32 nm was formed on the resist film by spin coating the immersion upper layer film composition shown in Table 7 and subjecting the composition to PB (130° C., 90 sec) (H-4 and H-5).

TABLE 7

| Resist film | Radiation-sensitive resin composition | Upper layer film composition |
|---|---|---|
| H-1 | F-1 | — |
| H-2 | F-2 | — |
| H-3 | F-3 | — |
| H-4 | F-1 | G-1 |
| H-5 | F-1 | G-2 |

Example 1

Commercially available trans-decalin (trans-decahydronaphthalene) was purified using the following method to obtain an immersion exposure liquid.

A 200 ml round bottom flask equipped with a glass-coated stirrer bar was charged with 100 ml of commercially available trans-decalin (manufactured by Tokyo Kasei Kogyo Co., Ltd.; transmittance of light with a wavelength of 193 nm of 10% or less at an optical path length of 1 mm). After the addition of 20 ml of concentrated sulfuric acid (manufactured by Wako Pure Chemical Industries, Ltd.), the mixture was stirred at 25° C. for 20 minutes at a stirrer bar rotational speed of 500 to 1,000 rpm. The concentrated sulfuric acid was then removed by separation. The above operation was carried out three times. The separated organic layer was washed once with 50 ml of deionised water and three times with a saturated sodium hydrogen carbonate aqueous solution. The organic layer was then washed with pure water three times. The pH of the resulting organic layer was confirmed to be 7.0 (neutral). After drying the organic layer with magnesium sulfate, the magnesium sulfate was removed by decantation. The resulting product was then subjected to reduced pressure distillation using a distillation apparatus equipped with a Widmer rectifying column with a length of 20 cm at a pressure of 10 mmHg to collect 16 10-ml fractions. The absorbance of light with a wavelength of 193 nm of each fraction was measured (according to the above measurement method A). As a result, 12 fractions had a transmittance of 93% or more at an optical path length of 1 mm to obtain 120 ml of trans-decalin with a transmittance of 90% or more at an optical path length of 1 mm. Each fraction was degassed under reduced pressure in a saturated nitrogen atmosphere and stored in a glass container of which the atmosphere had been replaced with nitrogen. The purity of the compound immediately after closing the container was analyzed by gas chromatography to indicate that the purity (hereinafter called "GC purity") was 99.92%. The purified trans-decalin obtained using the method of Example 1 is called purified trans-decalin (1).

Commercially available trans/cis-mixture decalin and commercially available cis-decalin were also purified using the above method.

Example 2

A sulfuric acid treatment was carried out in a nitrogen atmosphere in the same manner as in Example 1. Commercially available trans-decalin (manufactured by Tokyo Kasei Kogyo Co., Ltd.; transmittance of light with a wavelength of 193 nm of 10% or less at an optical path length of 1 mm) was purified in the same manner as in Example 1 to obtain a liquid with a transmittance of 96.8% at an optical path length of 1 mm. The dissolved oxygen concentration and the dissolved nitrogen concentration of the liquid were analyzed by gas chromatography (detector: TCD) to indicate that the dissolved oxygen concentration was less than 1 ppm (below the detection limit) and the dissolved nitrogen concentration was 119 ppm. The content of Li, Na, K, Mg, Cu, Ca, Al, Fe, Mn, Sn, Zn, and Ni of the liquid was measured using an atomic absorption method. The Ca content was 1 ppb, the Zn content was 6 ppb, and the content of the other metals was less than 1 ppb (below the detection limit). The purified trans-decalin obtained using the method of Example 2 is called purified trans-decalin (2).

This liquid may be used not only as an immersion exposure liquid, but also for an optical instrument used in the visible region due to low metal content.

After allowing the purified trans-decalin (2) obtained in Example 2 to stand in air (air saturation state), the transmittance of light with a wavelength of 193 nm was measured. The results are shown in Table 8.

TABLE 8

|  | Oxygen concentration (µg/ml) | Transmittance (%) (1 mm) |
|---|---|---|
| Purified trans-decalin (2) | <1 | 96.8 |
| trans-Decalin after air saturation | 61 | 74.8 |
| Pure water (air saturation) | 7 | 96.3 |

As shown in Table 8, it was confirmed that the transmittance increases when the oxygen concentration is not saturated.

A change in transmittance due to contact with the resist film was measured using the following method.

In a nitrogen glove box of which the atmosphere was replaced with nitrogen and the oxygen concentration was adjusted to 10 ppm or less, the liquid was placed for three minutes on the silicon wafer on which the resist films H-1 and H-4 were formed so that the thickness of the liquid film was 0.8 mm, and a change in transmittance of light with a wavelength of 193 nm was measured. Pure water was used as a comparative example. The results are shown in Table 9.

TABLE 9

|  | Before immersion | After immersion (H1) | After immersion (H4) |
|---|---|---|---|
| Purified trans-decalin (2) | 96.6% | 96.8% | 96.7% |
| Pure water | 98.0% | 97.1% | 96.0% |

As shown in Table 9, the transmittance of the purified trans-decalin (2) changed to only a small extent after contacting the resist film.

The solubility of an acid generator in the purified trans-decalin (2) was measured using the following method.

Triphenylsulfonium.nonafluoro-n-butanesulfonate was used as the acid generator. After adding a specific amount of the acid generator to 100 ml of the purified trans-decalin, the mixture was stirred for one hour. The solubility was determined by confirming whether or not the acid generator was completely dissolved with the naked eye. Pure water was used as a comparative example. The results are shown in Table 10.

TABLE 10

| Liquid | Water (100 ml) | trans-Decalin |
|---|---|---|
| Solubility of nonafluorobutanesulfonate | 50 g | 0.5 mg or less |

As shown in Table 10, the acid generator was dissolved in the purified trans-decalin (2) to only a small extent.

Example 3

Commercially available exo-tetrahydrodicyclopentadiene was purified using the following method to obtain an immersion exposure liquid.

A 200 ml round bottom flask equipped with a glass-coated stirrer bar was charged with 100 ml of commercially available exo-tetrahydrodicyclopentadiene (manufactured by Tokyo Kasei Kogyo Co., Ltd.; transmittance of light with a wavelength of 193 nm of 10% or less at an optical path length of 1 mm). After cooling the contents of the flask to 5° C. in an iced water bath, 20 ml of concentrated sulfuric acid (manufactured by Wako Pure Chemical Industries, Ltd.) was added to the flask. The mixture was then stirred at 25° C. for 20 minutes at a stirrer bar rotational speed of 500 to 1 000 rpm. The concentrated sulfuric acid was then removed by separation. The above operation was carried out three times. The separated organic layer was washed once with 50 ml of deionised water and three times with a saturated sodium hydrogen carbonate aqueous solution. The organic layer was then washed with pure water three times. The pH of the resulting organic layer was confirmed to be 7.0 (neutral). After drying the organic layer with magnesium sulfate, magnesium sulfate was removed by decantation. After bubbling nitrogen into 91 ml of the resulting liquid for 30 minutes, the transmittance of light with a wavelength of 193 nm was measured (under the above-described measurement conditions). The transmittance of the liquid was 87.7% or more at an optical path length of 1 mm. The liquid was degassed in a saturated nitrogen atmosphere and stored in a glass container of which the atmosphere had been replaced with nitrogen. The GC purity of the compound immediately after closing the container was 99.94%. The purified exo-tetrahydrodicyclopentadiene obtained using the method of Example 3 is called purified exo-tetrahydrodicyclopentadiene (1).

Example 4

A sulfuric acid treatment was carried out in a nitrogen atmosphere in the same manner as in Example 1. Commercially available exo-tetrahydrodicyclopentadiene was purified in the same manner as in Example 3, and subjected to reduced pressure distillation in a nitrogen atmosphere in the same manner as in Example 2 to obtain a liquid with a transmittance of 97.5% at an optical path length of 1 mm. The dissolved oxygen concentration and the dissolved nitrogen concentration of the liquid were analyzed by gas chromatography (detector: TCD) to indicate that the dissolved oxygen concentration was less than 1 ppm (below the detection limit) and the dissolved nitrogen concentration was 100 ppm. The purified exo-tetrahydrodicyclopentadiene obtained using the method of Example 4 is called purified exo-tetrahydrodicyclopentadiene (2).

Example 5

Commercially available trans-decalin (manufactured by Tokyo Kasei Kogyo Co., Ltd.) was purified in the same manner as in Example 1 except that the entire operation was carried out in a glove box of which the nitrogen concentration was adjusted to 0.5 ppm or less using nitrogen purified using a nitrogen purification device and reduced pressure distillation was carried out while controlling the control the pressure so that the steam temperature was 50° C. or less. The transmittance T of the purified compound per 1 mm calculated based on the absorbance measured using the above measurement method B was 99.5%. The oxygen concentration was measured by gas chromatography (detector: TCD) to indicate that the oxygen concentration was less than 1 ppm and the nitrogen concentration was 119 ppm. The GC purity was 99.92%. The purified trans-decalin obtained using the method of Example 5 is called purified trans-decalin (3).

Example 6

Commercially available exo-tetrahydrodicyclopentadiene (manufactured by Tokyo Kasei Kogyo Co., Ltd.) was purified in the same manner as in Example 3 except that the entire operation was carried out in a glove box of which the nitrogen concentration was adjusted to 0.5 ppm or less using nitrogen purified using a nitrogen purification device and reduced pressure distillation was carried out while controlling the control the pressure so that the steam temperature was 50° C. or less. The transmittance T of the purified compound per 1 mm calculated based on the absorbance measured using the above measurement method B was 99.6%. The oxygen concentration was measured by gas chromatography (detector: TCD) to indicate that the oxygen concentration was less than 1 ppm and the nitrogen concentration was 100 ppm. The GC purity was 97.80%. The purified exo-tetrahydrodicyclopentadiene obtained using the method of Example 6 is called purified exo-tetrahydrodicyclopentadiene (3).

Example 7

Commercially available dicyclohexyl, isopropylcyclohexane, cyclooctane, and cycloheptane were purified by sulfuric acid treatment in the same manner as in Example 3 to obtain immersion exposure liquids.

In the examples, the GC purity was analyzed under the following conditions.

The GC purity was measured using GC6850 manufactured by Agilent Technologies (column HP-1 (nonpolar type) manufactured by Agilent Technologies, detector: FID). The measurement was carried out at an inlet temperature of 250° C. and a column temperature of 70 to 300° C. (temperature rise method) using helium as the carrier gas. The purity was calculated from the area ratio based on the total peak area of the FID as 100%.

Examples 8 to 22 and
Comparative Examples 1 and 2

The immersion exposure liquid according to the present invention was evaluated by the elution test, film solubility test, patterning evaluation (immersion patterning evaluation and immersion exposure evaluation using two-beam interference exposure device), and change in absorbance (or contamination) due to contact with the resist using the above evaluation resist film. The results are shown in Tables 11 to 14. As shown in Table 3, the refractive index and the wavelength have a correlation in which the refractive index increases as the wavelength becomes shorter. Therefore, the refractive index at a short wavelength can be estimated by measuring the refractive index for D lines (wavelength: 589 nm). In particular, since the immersion exposure liquid according to the present invention has a chemical structure similar to that of decalin shown in Table 1, the refractive index can be estimated from the refractive index for D lines (wavelength: 589 nm). Therefore, the refractive index for D lines (wavelength: 589 nm) was measured. Each immersion exposure liquid had a refractive index higher than that of pure water.

The immersion exposure liquids of Examples 8 to 13 were purified using the method of Example 1, and the immersion exposure liquids of Examples 14 to 22 were purified based on the method of Example 1.

(1) Elution Test

The wafer to which the evaluation resist film was applied was immersed in 300 ml of the immersion exposure liquid shown in Table 11. After removing the wafer, the presence or absence of impurities in the remaining immersion exposure liquid was measured using an HPLC (manufactured by Shimadzu Corporation, column: Inertsil ODS-3 (10 mm (inner diameter)×250 mm (length)), solvent: acetonitrile/water=80/20, detector: UV@205 nm, 220 nm, 254 nm, amount of sample: 4 μm). The elution test result was indicated as "Bad" when impurities in an amount equal to or greater than the detection limit were confirmed by one of the detectors, and the elution test result was indicated as "Good" when impurities in an amount equal to or greater than the detection limit were not confirmed.

(2) Film Solubility Test

The initial thickness of the wafer to which the evaluation resist film was applied was measured. After immersing the wafer in 300 ml of the immersion exposure liquid shown in Table 11, the thickness of the wafer was again measured. When the amount of decrease in the thickness was 0.5% or less of the initial thickness, it was determined that the immersion exposure liquid does not dissolve the resist film ("Good"). When the amount of decrease in the thickness was 0.5% or more of the initial thickness, it was determined that the immersion exposure liquid dissolves the resist film ("Bad").

(3) Patterning Evaluation Test

Patterning Evaluation Test (1)

The wafer to which the evaluation resist film was applied was exposed (dose: 30 mJ/cm$^2$) using an ArF projection exposure device S306C (manufactured by Nikon Corporation) under optical conditions of NA: 0.78, sigma: 0.85, and 2/3 Ann. The wafer was then subjected to PEB (130° C., 90 sec) using a CLEAN TRACK ACT8 hot plate, subjected to puddle development (developer component: 2.38 wt % tetrahydroammonium hydroxide aqueous solution) using an LD nozzle of the CLEAN TRACK ACT8 hot plate (60 sec), rinsed with ultrapure water, and spin-dried at 4000 rpm for 15 seconds (developed substrate A). After immersing the patterned developed substrate A in the immersion exposure liquid shown in Table 11 for 30 seconds, the developed substrate A was subjected to PEB, developed, and rinsed in the same manner as described above to obtain a developed substrate B. The patterns of the developed substrates A and B corresponding to the 90 nm line/90 nm space mask pattern were observed using a scanning electron microscope S-9360 (manufactured by Hitachi Instruments Service Co., Ltd.). A case where an excellent rectangular resist pattern of the same shape was obtained for the developed substrates A and B by naked eye observation was indicated as "Good", and a case where an excellent pattern was not obtained was indicated as "Bad". "-" indicates that the pattern evaluation was not conducted.

Patterning Evaluation Test (2)

A wafer exposed under the same conditions as in the patterning evaluation test (1) was immersed in the immersion exposure liquid for 30 seconds, subjected to PEB, developed, and rinsed in the same manner as described above to obtain a developed substrate C. A case where an excellent rectangular resist pattern of the same shape was obtained for the developed substrates A and C by naked eye observation was indicated as "Good", and a case where a pattern of the same shape was not obtained was indicated as "Bad". "-" indicates that the pattern evaluation was not conducted.

(4) Contact Angle Measurement Experiment

The contact angle of trans-decalin with respect to the resist films H2, H4, and H5 and quartz glass was measured using a Mode IDSA10L2E manufactured by Kruss (measurement method: Elipse (tangent1) method). The results are shown in Table 12.

(5) Exposure Experiment Using Two-Beam Interference

An evaluation resist film produced in the same manner as the resist film H2 except for changing the thickness of the lower-layer anti-reflective film to 29 nm and changing the resist thickness to 100 nm (for 45 nm) and 60 nm (for 35 nm) was applied to a wafer. The wafer was exposed using a two-beam interference ArF immersion exposure device (manufactured by Canon Inc. (45 nm 1L/1S) and manufactured by Nikon Corporation (35 nm 1L/1S), TE polarized light exposure) in a state in which the above purified immersion exposure liquid was provided between the lens and the wafer (gap: 0.7 mm). After removing the immersion exposure liquid on the wafer by air drying, the wafer was then subjected to PEB (115° C., 90 sec) using a CLEAN TRACK ACT8 hot plate, subjected to puddle development (developer component: 2.38 wt % tetrahydroammonium hydroxide aqueous solution) using an LD nozzle of the CLEAN TRACK ACT8 hot plate (60 sec), and rinsed with ultrapure water. The pattern of the developed substrate was observed using a scanning electron microscope S-9360 (manufactured by Hitachi Instruments Service Co., Ltd.). A case where an excellent resist pattern with desired L/S (1L/1S) dimensions was obtained was indicated as "Good", and a case where an excellent pattern was not obtained was indicated as "Bad". The results are shown in Table 13.

(6) Change in Absorbance (or Contamination) Due to Contact with Resist

A liquid (deionised water or purified trans-decalin (2) (product of another lot purified using the method of Example 2) was added to a petri dish with a diameter of 6 cm using a pipette made of glass. The amount of the liquid was adjusted so that the thickness of the liquid was 1 mm. The upper part of the petri dish was covered with a silicon wafer to which photoresist (H1 and H4) was applied. The wafer and the petri dish were turned upside down so that the photoresist film was immersed in the liquid. The wafer and the petri dish were closely secured so that the liquid did not leak out through the space between the petri dish and the wafer. The wafer was carefully placed horizontally so that the photoresist was uniformly immersed in the liquid over the entire portion covered with the petri dish. After immersing the photoresist for a specific period of time, the wafer and the petri dish were again turned upside down. After performing the above operations, the liquid was collected and subjected to absorbance measurement at 193.4 nm using the method B. The absorbance per centimeter was calculated based on the measured value. The above operations were carried out in a glove box at 23° C. filled with nitrogen. The results are shown in Table 14.

TABLE 11

| | | Immersion exposure liquid | | | | | Patterning evaluation | |
|---|---|---|---|---|---|---|---|---|
| | | | Refractive index | | Resist | | | |
| | Name | 193 nm | 589 nm | film | Elution | Film solubility | Test (1) | Test (2) |
| Example | | | | | | | | |
| 8 | cis-Decalin | 1.64 | 1.48 | H1 | Good | Good | Good | Good |
| 9 | cis-Decalin | 1.64 | 1.48 | H2 | Good | Good | Good | Good |
| 10 | cis-Decalin | 1.64 | 1.48 | H3 | Good | Good | Good | Good |
| 11 | cis-Decalin | 1.64 | 1.48 | H4 | Good | Good | Good | Good |
| 12 | cis-Decalin | 1.64 | 1.48 | H5 | Good | Good | Good | Good |
| 13 | trans-Decalin | — | 1.47 | H1 | Good | Good | Good | Good |
| 14 | Spiro[5.5]undecane | — | 1.48 | H1 | Good | Good | Good | Good |
| 15 | exo-Tetrahydrodicyclopentadien | 1.65 | 1.49 | H1 | Good | Good | Good | Good |
| 16 | 5-Silacyclo[4.4]nonane | — | 1.49 | H1 | Good | Good | Good | Good |
| 17 | 1-Ethyladamantane | — | 1.50 | H1 | Good | Good | Good | Good |
| 18 | 1,1,1-Tricycloheptylmethane | — | 1.51 | H1 | Good | Good | Good | Good |
| 19 | Dicyclohexyl | 1.64 | 1.48 | H1 | Good | Good | Good | Good |
| 20 | Isopropylcyclohexane | 1.59 | 1.44 | H1 | Good | Good | Good | Good |
| 21 | Cyclooctane | — | 1.46 | H1 | Good | Good | Good | Good |
| 22 | Cycloheptane | — | 1.44 | H1 | Good | Good | Good | Good |
| Comparative Example | | | | | | | | |
| 1 | Pure water | 1.44 | 1.34 | H1 | Bad | Good | Good | Bad (T-top) |
| 2 | Methylene iodide | — | — | H1 | Bad | Bad | Bad (film was dissolved) | Bad (film was dissolved) |

TABLE 12

| Resist film | Contact angle (°) |
|---|---|
| H2 | 23 |
| H4 | 63.5 |
| H5 | 64 |
| Quartz glass | 10 or less |

TABLE 13

| Immersion liquid | Half pitch | Sensitivity (Ecd) mL/cm² | Pattern shape |
|---|---|---|---|
| Purified trans-decalin (1) | 45 nm | 27.1 | Good |
| Purified trans-decalin (1) | 35 nm | — | Good |
| Purified trans-decalin (2) | 45 nm | 22.7 | Good |
| Purified trans-decalin (2) | 35 nm | — | Good |
| Purified exo-tetrahydrodicyclopentadiene (1) | 45 nm | 28.6 | Good |
| Purified exo-tetrahydrodicyclopentadiene (1) | 35 nm | — | Good |
| Purified exo-tetrahydrodicyclopentadiene (2) | 45 nm | 23 | Good |
| Purified exo-tetrahydrodicyclopentadiene (2) | 35 nm | — | Good |
| Isopropylcyclohexane | 45 nm | — | Good |
| Isopropylcyclohexane | 35 nm | — | Not resolved |
| Cyclooctane | 45 nm | — | Good |
| Cyclooctane | 35 nm | — | Not resolved |
| Water | 45 nm | — | T-top |

TABLE 14

| | Wafer | Immersion time (sec) | Absorbance at 193 nm before immersion | Absorbance at 193 nm after immersion | Change in absorbance |
|---|---|---|---|---|---|
| Pure water | H1 | 30 | 0.0838 | 0.2169 | 0.1331 |
| | | 180 | | 0.2577 | 0.1739 |
| | H4 | 30 | | 0.0917 | 0.0079 |
| | | 180 | | 0.2298 | 0.1460 |
| Purified trans-decalin (2) | H1 | 30 | 0.1421 | 0.1414 | −0.0007 |
| | | 180 | | 0.1397 | −0.0024 |
| | H4 | 30 | | 0.1417 | −0.0004 |
| | | 180 | | 0.1421 | 0 |

As shown in Table 11, since the immersion exposure liquid according to the present invention exhibits a refractive index higher than that of pure water and has the chemical structure of any of the formulas (1-1) to (1-9), the immersion exposure liquid provides an excellent resolution, does not dissolve the resist film or the resist film on which the upper layer film, does not elute the film component, and does not change the resist pattern shape. As shown in Table 14, it was found that the purified decalin does not show a change in absorbance after extraction for an immersion time of 180 seconds.

It was also found that the degree of contamination of the immersion exposure liquid can be evaluated by contacting the immersion exposure liquid with the photoresist film formed on the substrate in a nitrogen atmosphere comparing the absorbances of the liquid measured for light with a wavelength of 193 nm before and after the contact.

INDUSTRIAL APPLICABILITY

Since the immersion exposure liquid according to the present invention is an alicyclic hydrocarbon compound or a cyclic hydrocarbon compound containing a silicon atom in its ring structure, the immersion exposure liquid does not dissolve the photoresist film during immersion exposure, can form a resist pattern exhibiting an excellent resolution, developability, and the like, and may be suitably used in the manufacture of semiconductor devices which are expected to be increasingly scaled down.

The invention claimed is:

1. An immersion exposure liquid used for an immersion exposure device or an immersion exposure method in which a substrate is exposed through a liquid provided between a lens of a projection optical system and the substrate, the immersion exposure liquid being liquid in an operating temperature range of the immersion exposure device and comprising an alicyclic hydrocarbon compound or a cyclic hydrocarbon compound containing a silicon atom in its ring structure, wherein the alicyclic hydrocarbon compound or the cyclic hydrocarbon compound containing a silicon atom in its ring structure has a transmittance of radiation with a wavelength of 193 nm of 70% or more at an optical path length of 1 mm and has a refractive index for D lines of 1.4 or more.

2. The immersion exposure liquid according to claim 1, wherein the alicyclic hydrocarbon compound or the cyclic hydrocarbon compound containing a silicon atom in its ring structure is at least one compound selected from compounds of the following formulas (1-1) to (1-9),

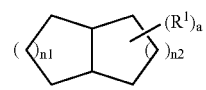

(1-1)

wherein $R^1$ represents an aliphatic hydrocarbon group having 1 to 10 carbon atoms, an alicyclic hydrocarbon group having 3 to 14 carbon atoms, a fluorine atom, or a fluorine-substituted hydrocarbon group having 1 to 3 carbon atoms, n1 and n2 individually represent integers from 1 to 3, a represents an integer from 0 to 10, and provided that, when two or more $R^1$s exist, the $R^1$s may be the same or different, and two or more $R^1$s may be bonded to form a ring structure,

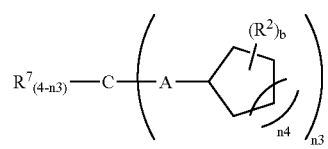

(1-2)

wherein A represents a single bond, a methylene group which may be replaced with an alkyl group having 1 to 10 carbon atoms, or an alkylene group having 2 to 14 carbon atoms which may be replaced with an alkyl group having 1 to 10 carbon atoms, 1(2 represents an aliphatic hydrocarbon group having 1 to 10 carbon atoms, an alicyclic hydrocarbon group having 3 to 14 carbon atoms, a fluorine atom, or a fluorine-substituted hydrocarbon group having 1 to 3 carbon atoms, $R^7$ represents a hydrogen atom, an alkyl group having 1 to 10 carbon atoms, a fluorine atom, or a fluorine-substituted alkyl group having 1 to 3 carbon atoms, provided that, when two or more $R^7$s exist, the $R^7$s may be the same or different, and two or more $R^7$s may be bonded to form a ring structure, n3 represents an integer from 2 to 4, n4 represents an integer from 1 to 3, b represents an integer from 0 to 6, and provided that, when two or more R²s exist, the R²s may be the same or different, and two or more R²s may be bonded to form a ring structure,

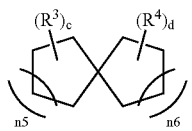

(1-3)

wherein R³ and R⁴ represent an aliphatic hydrocarbon group having 1 to 10 carbon atoms, an alicyclic hydrocarbon group having 3 to 14 carbon atoms, a fluorine atom, or a fluorine-substituted hydrocarbon group having 1 to 3 carbon atoms, provided that, when two or more R³ s and R⁴s exist, the R³s and the R⁴s may be respectively the same or different, and two or more R³s and R⁴s may respectively form ring structures or may be bonded to form a ring structure, n5 and n6 represent integers from 1 to 3, and c and d represent integers from 0 to 8,

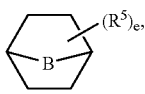

(a)

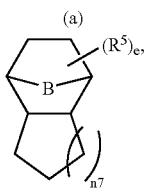

(b)

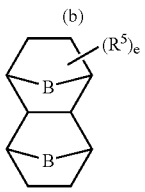

(c)

(1-4)

wherein B represents a methylene group or an ethylene group, R⁵ represents an aliphatic hydrocarbon group having 1 to 10 carbon atoms, an alicyclic hydrocarbon group having 3 to 14 carbon atoms, a fluorine atom, or a fluorine-substituted hydrocarbon group having 1 to 3 carbon atoms, e represents an integer from 0 to 10, n7 represents an integer from 1 to 3, and provided that, when two or more R⁵s exist, the R⁵s may be the same or different, and two or more R⁵s may be bonded to form a ring structure,

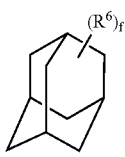

(1-5)

wherein R¹ represents an aliphatic hydrocarbon group having 1 to 10 carbon atoms, an alicyclic hydrocarbon group having 3 to 14 carbon atoms, a fluorine atom, a fluorine-substituted hydrocarbon group having 1 to 3 carbon atoms, f represents an integer from 0 to 10, and provided that, when two or more R⁶s exist, the R⁶s may be the same or different,

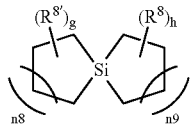

(1-6)

wherein R⁸ and R⁸' represent an aliphatic hydrocarbon group having 1 to 10 carbon atoms, an alicyclic hydrocarbon group having 3 to 14 carbon atoms, a fluorine atom, or a fluorine-substituted hydrocarbon group having 1 to 3 carbon atoms, g and h individually represent integers from 0 to 6, and n8 and n9 represent integers from 1 to 3,

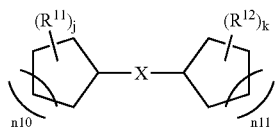

(1-7)

wherein R¹¹ and R¹² represent an aliphatic hydrocarbon group having 1 to 10 carbon atoms, an alicyclic hydrocarbon group having 3 to 14 carbon atoms, a fluorine atom, or a fluorine-substituted hydrocarbon group having 1 to 3 carbon atoms, n10 and n11 individually represent integers from 1 to 3, j and k represent integers from 0 to 6, provided that, when two or more R¹¹s and R¹²s exist, the R¹¹s and the R¹²s may be the same or different, and two or more R¹¹s may be bonded to form a ring structure or two or more R¹²s may be bonded to form a ring structure, and X represents a single bond, a divalent aliphatic hydrocarbon group having 2 to 10 carbon atoms, or a divalent alicyclic hydrocarbon group having 3 to 14 carbon atoms,

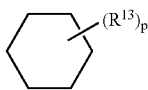

(1-8)

wherein R¹³ represents an alkyl group having two or more carbon atoms, an alicyclic hydrocarbon group having three or more carbon atoms, a fluorine atom, or a fluorine-substituted hydrocarbon group having 2 to 3 carbon atoms, p represents an integer from 1 to 6, and provided that, when two or more R¹³s exist, the R¹³s may be the same or different, and two or more R¹³s may be bonded to form a ring structure,

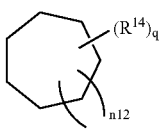

(1-9)

wherein $R^{14}$ represents an aliphatic hydrocarbon group having 1 to 10 carbon atoms, an alicyclic hydrocarbon group having 3 to 14 carbon atoms, a fluorine atom, or a fluorine-substituted hydrocarbon group having 1 to 3 carbon atoms, n12 represents an integer from 1 to 3, q represents an integer from 0 to 9, and provided that, when two or more $R^{14}$s exist, the $R^{14}$s may be the same or different.

3. The immersion exposure liquid according to claim 2, wherein the compound of the formula (1-1) is shown by the following formula (2-1), and the compound of the formula (1-4) is shown by the following formula (2-2),

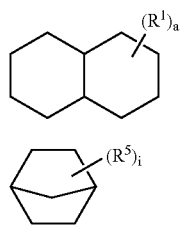

(2-1)

(2-2)

wherein, in the formula (2-1), $R^1$ represents an aliphatic hydrocarbon group having 1 to 10 carbon atoms, an alicyclic hydrocarbon group having 3 to 14 carbon atoms, a fluorine atom, or a fluorine-substituted hydrocarbon group having 1 to 3 carbon atoms, a represents an integer from 0 to 10, and provided that, when two or more $R^1$s exist, the $R^1$s may be the same or different, and two or more $R^1$s may be bonded to form a ring structure, and, in the formula (2-2), $R^5$ represents an aliphatic hydrocarbon group having 1 to 10 carbon atoms, an alicyclic hydrocarbon group having 3 to 14 carbon atoms, a fluorine atom, or a fluorine-substituted hydrocarbon group having 1 to 3 carbon atoms, represents an integer from 0 to 2, and provided that, when two or more $R^5$s exist, the $R^5$s may be the same or different, and two or more $R^5$s may be bonded to form a ring structure.

4. The immersion exposure liquid according to claim 3, wherein the compound of the formula (2-1) is trans-decahydronaphthalene, and the immersion exposure liquid has a transmittance of radiation with a wavelength of 193 nm of 95% or more at an optical path length of 1 mm and a dissolved oxygen content of 2 ppm or less.

5. The immersion exposure liquid according to claim 4, wherein the immersion exposure liquid is a liquid with a purity of 95 wt % or more which is obtained by subjecting a trans-decahydronaphthalene raw material to washing with concentrated sulfuric acid and distillation in a nitrogen atmosphere.

6. The immersion exposure liquid according to claim 3, wherein the compound of the formula (2-2) is exo-tetrahydrodicyclopentadiene, and the immersion exposure liquid has a transmittance of radiation with a wavelength of 193 nm of 95% or more at an optical path length of 1 mm and a dissolved oxygen content of 2 ppm or less.

7. The immersion exposure liquid according to claim 6, wherein the immersion exposure liquid is a liquid with a purity of 95 wt % or more which is obtained by subjecting an exo-tetrahydrodicyclopentadiene raw material to washing with concentrated sulfuric acid and distillation in a nitrogen atmosphere.

8. The immersion exposure liquid according to claim 1, wherein, when contacting the liquid with a photoresist film for 180 seconds in a nitrogen atmosphere so that the liquid film has a thickness of 1 mm, the liquid shows a change in absorbance of light with a wavelength of 193 nm of 0.05 or less before and after the contact at an optical path length of 1 cm.

9. The immersion exposure liquid according to claim 1, wherein the immersion exposure liquid contains the alicyclic hydrocarbon compound or the cyclic hydrocarbon compound containing a silicon atom in its ring structure in an amount of 95 wt % or more of the immersion exposure liquid.

10. The immersion exposure liquid according to claim 1, wherein the immersion exposure liquid has a dissolved oxygen content of 2 ppm or less.

11. The immersion exposure liquid according to claim 1, wherein the immersion exposure liquid has a total metal content of 10 ppb or less.

12. The immersion exposure liquid according to claim 11, wherein the metal is at least one metal selected from lithium, sodium, potassium, magnesium, copper, calcium, aluminum, iron, zinc, and nickel.

13. The immersion exposure liquid according to claim 1, wherein the immersion exposure liquid has a viscosity of 0.01 Pa·s or less at 25° C.

14. The immersion exposure liquid according to claim 1, wherein the immersion exposure liquid has a refractive index of 1.63 or more at a wavelength of 193 nm.

15. The immersion exposure liquid according to claim 14, wherein the immersion exposure liquid has a transmittance of radiation with a wavelength of 193 nm of 95% or more at an optical path length of 1 mm.

16. A method of producing the immersion exposure liquid according to claim 1, the method comprising subjecting the liquid comprising the alicyclic hydrocarbon compound or the cyclic hydrocarbon compound containing a silicon atom in the ring structure to at least one of washing with concentrated sulfuric acid and distillation in a nitrogen atmosphere.

17. An immersion exposure method comprising applying an exposure beam to a mask and exposing a substrate using the exposure beam through a liquid provided between a lens of a projection optical system and the substrate, the liquid being the immersion exposure liquid according to claim 1.

18. An immersion exposure method comprising applying an exposure beam to a mask and exposing a substrate using the exposure beam through a liquid provided between a lens of a projection optical system and the substrate, the liquid being the immersion exposure liquid according to claim 1, wherein an immersion upper layer film is formed on a surface of a resist film on the substrate, the immersion upper layer film containing a resin component which is soluble in an alkaline developer and insoluble in the immersion exposure liquid and containing at least one of a hexafluorocarbinol group and a carboxyl group as a substituent for providing the alkali solubility.

* * * * *